(12) United States Patent
Woo

(10) Patent No.: US 12,322,627 B2
(45) Date of Patent: Jun. 3, 2025

(54) WAFER STORAGE CONTAINER

(71) Applicants: PICO & TERA CO., LTD., Suwon-si (KR); Bum Je Woo, Seongnam-si (KR)

(72) Inventor: Bum Je Woo, Seongnam-si (KR)

(73) Assignees: Bum Je Woo, Seongnam-si (KR); PICO & TERA CO., LTD., Suwon-si (KR)

( * ) Notice: Subject to any disclaimer, the term of this patent is extended or adjusted under 35 U.S.C. 154(b) by 0 days.

(21) Appl. No.: 18/623,772

(22) Filed: Apr. 1, 2024

(65) Prior Publication Data

US 2024/0242992 A1 Jul. 18, 2024

Related U.S. Application Data

(63) Continuation of application No. 17/738,939, filed on May 6, 2022, now Pat. No. 11,984,336.

(30) Foreign Application Priority Data

May 7, 2021 (KR) .................. 10-2021-0059530

(51) Int. Cl.
 *H01L 21/673* (2006.01)
(52) U.S. Cl.
 CPC .... *H01L 21/67393* (2013.01); *H01L 21/6732* (2013.01); *H01L 21/67386* (2013.01)
(58) Field of Classification Search
 CPC ... H01L 21/67; H01L 21/673; H01L 21/6735; H01L 21/67359; H01L 21/39393; H01L 21/3732; H01L 21/67386; H01L 21/37383; B65D 85/48

USPC ....................................... 206/710
See application file for complete search history.

(56) References Cited

U.S. PATENT DOCUMENTS

| 6,899,145 B2 | 5/2005 | Aggarwal | |
| 2004/0182472 A1* | 9/2004 | Aggarwal | H01L 21/67393 |
| | | | 141/98 |
| 2016/0118282 A1* | 4/2016 | Maraschin | H01L 21/67769 |
| | | | 206/711 |
| 2019/0229000 A1 | 7/2019 | Kuan | |

FOREIGN PATENT DOCUMENTS

| JP | 2012-4199 A | 1/2012 |
| JP | 5528308 B2 | 6/2014 |
| KR | 10-2006-0071492 A | 6/2006 |
| KR | 10-1090350 B1 | 12/2011 |
| KR | 10-1366135 B1 | 2/2014 |
| KR | 10-1671873 B1 | 11/2016 |

(Continued)

OTHER PUBLICATIONS

Request for the Submission of an Opinion for Korean Patent Application No. 10-2021-0059530, dated Aug. 30, 2022.

(Continued)

*Primary Examiner* — King M Chu

(57) ABSTRACT

A wafer storage container is connected to an external chamber and has a storage chamber in which wafers received through a front opening are accommodated. The wafer storage container includes a fume removal unit that injects a first gas into the storage chamber and exhausts the first gas, and an outside air blocking unit that injects a second gas from a left side of the front opening and exhausts the second gas from a right side of the front opening.

10 Claims, 15 Drawing Sheets

(56) References Cited

FOREIGN PATENT DOCUMENTS

| KR | 20-0483073 Y1 | 4/2017 |
| KR | 10-2019-0122040 A | 10/2019 |
| KR | 10-2146517 B1 | 8/2020 |

OTHER PUBLICATIONS

The Written Decision on Registration for Korean Patent Application No. 10-2021-0059530, dated Mar. 14, 2023.
Written Decision on Registration for Korean Patent Application No. 10-2023-0055574, dated Feb. 26, 2025.

* cited by examiner

WAFER STORAGE CONTAINER

CROSS REFERENCE TO RELATED APPLICATION

The present application is a continuation application of U.S. patent application Ser. No. 17/738,939, filed on May 6, 2022, which claims priority to Korean Patent Application No. 10-2021-0059530, filed on May 7, 2021, the entire contents of which is incorporated herein for all purposes by this reference.

BACKGROUND OF THE INVENTION

Field of the Invention

The present disclosure relates to a wafer storage container for accommodating wafers in a storage chamber.

Description of the Related Art

In general, semiconductor devices are manufactured by selectively and repeatedly performing a series of processes on wafers such as deposition, polishing, photolithography, etching, ion implantation, cleaning, inspection, thermal treatment, etc., and wafers are transferred to a predetermined location required in each process to be formed into a semiconductor device.

Such wafers are high-precision products and are stored or transferred while being accommodated in a wafer storage container such as a front-opening unified pod (FOUP), etc. so as to avoid contamination or damage from external contaminants and shocks.

However, process gases used during the processes and fumes that are by-products generated during the processes, etc. may not be eliminated but remain on the surfaces of the wafers. Consequently, problems including contamination of semiconductor manufacturing equipment or etch pattern defects, etc. during the processes may occur, resulting in degraded reliability of the wafers.

In order to solve these problems, purging techniques that remove fumes remaining on the surface of a wafer or prevents oxidation of the wafer by supplying a purge gas to the wafer stored in the wafer storage container have been developed recently.

The purging technique involves removing fumes by supplying, that is, injecting the purge gas to the wafer stored in the wafer storage container, and exhausting the injected purge gas together with the fumes.

However, there is a problem that, when contaminants enter from an external chamber connected to the wafer storage container, the contamination of the wafer is not completely removed even by the purging.

To be specific, the wafer storage container is connected to the external chamber such as a wafer transfer chamber of an equipment front end module (EFEM), and the wafer transferred by a robot arm from the wafer transfer chamber, that is, the external chamber, is accommodated in a storage chamber of the wafer storage container. Since the wafer storage container is continuously in communication with the external chamber, the problem that the contaminated outside air of the external chamber flows into the inside of the wafer storage container occurs.

In order to solve this problem, a wafer storage container that prevents the contaminated outside air of the external chamber from flowing into the wafer storage container is being developed. As such wafer storage containers, the one described in Korea Patent No. 10-1090350 (hereinafter referred to as Patent Document 1) and the one described in Korean Utility Model No. 20-0483073 (hereinafter referred to as Patent Document 2) are known.

The wafer storage container disclosed in Patent Document 1 prevents contaminated outside air from entering the wafer storage container from the external chamber by having nozzles arranged at equal intervals on the upper pipe of an air curtain or nozzles arranged at equal intervals on the side pipe of the air curtain to inject air in the moving direction of the wafer.

However, when the air is injected by the nozzles of the upper pipe, as the wafer enters, the air collides with the upper surface of the wafer and resistance is created, so the inject amount and the inject force of the air have to be low, which causes a problem that the outside air may flow into the wafer storage container. In addition, as the wafer enters, the wafer blocks the air, so the outside air may flow into the wafer storage container through the lower area of the wafer.

When the air is injected by the nozzles of the side pipes facing each other, the injected air collides with each other to generate turbulence and the air does not have enough inject force to block the outside air, and thus, the outside air may flow into the wafer storage container.

The wafer storage container disclosed in Patent Document 2 has the same problems as the nozzles of the upper pipe of Patent Document 1 described above have, although the outside air is blocked by air blown from top to bottom by an air drop member.

A curtain member of Patent Document 2 may not effectively prevent the outside air from entering the front area of the wafer and turbulence may be generated since the air injected from an air inject slot is injected in the direction of the wafer accommodated in the wafer storage container.

DOCUMENTS OF RELATED ART

Patent Documents (Patent Document 0001) Korea Patent No. 10-1090350
(Patent Document 0002) Korean Utility Model Registration No. 20-0483073

SUMMARY OF THE INVENTION

Accordingly, the present disclosure has been made keeping in mind the above problems occurring in the related art, and the present disclosure is intended to provide a wafer storage container that can effectively block contaminated outside air flowing into the wafer storage container from the external chamber.

In order to achieve the above objective, according to an embodiment of the present disclosure, there is provided a wafer storage container connected to an external chamber and having a storage chamber in which wafers received through a front opening are accommodated, the wafer storage container, including: a fume removal unit that injects a first gas into the storage chamber and exhausts the first gas; and an outside air blocking unit that injects a second gas from a first side of a side of the front opening and exhausts the second gas from a second side of the side of the front opening.

In addition, the first gas injected from the fume removal unit may be exhausted to a first gas exhaust part of the fume removal unit, and the second gas injected from the outside air blocking unit may be exhausted to a second gas injection nozzle of the outside air blocking unit.

In addition, the outside air blocking unit may obliquely inject the second gas so that the injected second gas is directed toward a front of the wafer storage container toward the second side of the side of the front opening.

In addition, the outside air blocking unit may obliquely exhaust the second gas so that the exhausted second gas is directed toward a rear of the wafer storage container toward the second side of the side of the front opening.

In addition, the wafer storage container further includes a support for supporting the wafers, and wherein the outside air blocking unit may include: a second gas injection nozzle having a plurality of second gas injection ports for injecting the second gas at upper and lower sides thereof, and located in front of the support; and a second gas exhaust nozzle having a plurality of second gas exhaust ports for exhausting the second gas at the upper and lower sides thereof, and located in front of the support.

In addition, the first side of the side of the front opening may be an injection surface provided with the plurality of second gas injection ports in the second gas injection nozzle, wherein the injection surface may be formed to be inclined to the first side of the wafer storage container toward the front of the wafer storage container, and the second side of the side of the front opening may be an exhaust surface provided with the plurality of second gas exhaust ports in the second gas exhaust nozzle, wherein the exhaust surface may be formed to be inclined to the second side of the wafer storage container toward the front of the wafer storage container.

In addition, an arrangement height of the plurality of second gas injection ports and an arrangement height of the plurality of second gas exhaust ports may be different from each other so that the second gas is not horizontally injected and exhausted when the second gas injected from each of the plurality of second gas injection ports is exhausted to each of the plurality of second gas exhaust ports.

According to another embodiment of the present disclosure, a wafer storage container connected to an external chamber and having a storage chamber in which wafers received through a front opening are accommodated, the wafer storage container, includes: a main body having a front area between the storage chamber and the front opening, in which an area except for the front opening is closed; a fume removal unit that injects a first gas into the storage chamber and exhausts the first gas; and an outside air blocking unit that injects a second gas from a first side of the front area and exhausts the second gas from a second side of the front area.

In addition, the outside air blocking unit may include: a second gas injection port provided on a first side surface of the front area to inject the second gas; and a second gas exhaust port provided on a second side surface of the front area to exhaust the second gas.

In addition, the wafer storage container further includes a support for supporting the wafers, and wherein the outside air blocking unit may include: a second gas injection guide part that guides the second gas so that the second gas injected from the second gas injection port is directed toward a front of the wafer storage container as going toward the second side of the front area, and is provided on at least one of an upper surface of the front first side of the support and a lower surface of the front second side of the support; and a second gas exhaust guide part that guides the second gas so that the second gas exhausted from the second gas exhaust port is directed toward a rear of the wafer storage container as going toward the second side of the front area, and is provided on at least one of an upper surface of the front first side of the support and a lower surface of the front second side of the support.

In addition, the second gas injection port may be provided in plurality at upper and lower sides, and the second gas exhaust port may be provided in plurality at upper and lower sides, wherein an arrangement height of the plurality of second gas injection ports and an arrangement height of the plurality of second gas exhaust ports may be different from each other so that the second gas is not horizontally injected and exhausted when the second gas injected from each of the plurality of second gas injection ports is exhausted to each of the plurality of second gas exhaust ports.

According to another embodiment of the present disclosure, a wafer storage container connected to an external chamber and having a storage chamber in which wafers received through a front opening are accommodated, the wafer storage container, includes: a fume removal unit that injects a first gas into the storage chamber and exhausts the first gas; and an outside air blocking unit that injects and exhausts the second gas from top to bottom in a front area of the front opening.

In addition, the outside air blocking unit may include: a second gas injection nozzle that injects the second gas from top to bottom; and a second gas exhaust nozzle disposed under the second gas injection nozzle to exhaust the second gas injected from the second gas injection nozzle.

In addition, the wafer storage container further includes a plurality of supports provided in the storage chamber in a vertical direction to support a plurality of wafers, respectively, and wherein the second gas injection nozzle may be located above the support located at the highest position among the plurality of supports, and the second gas exhaust nozzle may be located below the support located at the lowest position among the plurality of supports.

In addition, the wafer storage container further includes a plurality of supports provided in the storage chamber in a vertical direction to support a plurality of wafers, respectively, and wherein a plurality of second gas injection nozzles and a plurality of second gas exhaust nozzles may be provided so that outside air is blocked on each of the plurality of wafers supported on each of the plurality of supports, and each of the plurality of second gas injection nozzles and the plurality of second gas exhaust nozzles may be disposed above and below each of the plurality of supports, wherein a number of the plurality of supports, a number of the plurality of wafers, a number of the plurality of second gas injection nozzles, and a number of the plurality of second gas exhaust nozzles may be the same.

In addition, in each of the plurality of second gas injection nozzles and in each of the plurality of second gas exhaust nozzles, injection and exhaust may be performed individually.

The wafer storage container according to the present disclosure as described above has following effects.

Fumes remaining on a wafer can be effectively removed by the fume removal unit, and outside air flowing into a storage chamber 160 can be blocked by the outside air blocking unit.

Unlike in the conventional wafer storage container that blocks the outside air by injecting and exhausting gas in the vertical direction, the second gas flows in the horizontal direction (or a direction inclined from horizontal to upper or lower) to block the outside air, so that the blocking of the outside air is continuously made without interruption when a robot arm stores wafers in the storage chamber.

In the conventional wafer storage container that blocks the outside air by injecting and exhausting gas in the vertical direction, the gas collides with the upper and lower surfaces of the wafer, so when the injection pressure of the gas is increased, the wafer may be shaken up and down, causing damage to the wafer. However, in the present disclosure, the second gas flows in a horizontal direction (or a direction inclined from horizontal to upper or lower) to block the outside air, so, even if the injection pressure of the second gas is increased in order to block the outside air with the stronger injection pressure of the second gas, the up and down shaking of the wafer is minimized, thereby minimizing damage to the wafer.

By injecting the second gas obliquely in the front direction of the wafer storage container and exhausting the second gas obliquely in the rear direction of the wafer storage container, the injection and exhaust of the second gas to the outer area of the storage chamber are effectively performed, and thus, the inflow of the outside air through the external chamber into the storage chamber can be achieved more effectively.

By injecting the second gas obliquely in the front direction of the wafer storage container and exhausting the second gas obliquely in the rear direction of the wafer storage container, the second gas can be effectively injected and exhausted through the outside air blocking unit with relatively small area, and thus, it is possible to make the wafer storage container more compact.

The outside air blocking unit is provided on a support and inner walls, so it is possible to manufacture a compact wafer storage container.

As the flow of the second gas flowing from the plurality of second gas injection ports to the plurality of second gas exhaust ports is inclined from the bottom to the top or from the top to the bottom, the flow of the second gas is generated in a relatively wider area than when the flow of the second gas flows in the horizontal direction, and thus, it is possible to more effectively block the outside air flowing in from the external chamber.

As each of the plurality of second gas injection nozzles and each of the plurality of second gas exhaust nozzles individually inject and exhaust the second gas, it is possible to block only the outside air of the front of the desired support among the plurality of supports.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

The following merely exemplifies the principles of the disclosure. Therefore, those skilled in the art will be able to devise various devices which, although not explicitly described or shown herein, embody the principles of the disclosure and are included within the spirit and scope of the disclosure. In addition, it should be understood that all conditional terms and examples listed herein are, in principle, expressly intended only for the purpose of understanding the inventive concept and are not limited to the specifically enumerated embodiments and states as such.

The above objects, features and advantages will become more apparent through the following detailed description in conjunction with the accompanying drawings, and accordingly, those skilled in the art to which the disclosure pertains will be able to easily practice the technical idea of the disclosure.

Embodiments described herein will be described with reference to cross-sectional and/or perspective views, which are ideal illustrative drawings of the present disclosure. Accordingly, embodiments of the present disclosure are not limited to the specific form shown, but also include changes in the form generated according to the manufacturing process.

The "first gas" and the "second gas" mentioned below may be a "purge gas", and the "purge gas" is a generic term for an inert gas for removing fumes from a wafer. In particular, the purge gas may be nitrogen (N2) gas, which is one of the inert gases.

In addition, "purging" is a generic term for preventing oxidation of the wafer by spraying a purge gas on the wafer to remove fumes remaining on the wafer surface or removing humidity inside a storage chamber.

In FIGS. 1 to 5, upper plates of the wafer storage containers 10, 10" are not shown for ease of explanation, however, the wafer storage containers 10, 10" are provided with the upper plates, and upper surfaces of the wafer storage containers 10, 10" are closed.

Wafer Storage Container 10 According to a First Preferred Embodiment of the Present Disclosure Hereinafter, a wafer storage container 10 according to a first preferred embodiment of the present disclosure will be described with reference to FIGS. 1 to 3.

Figure 1:
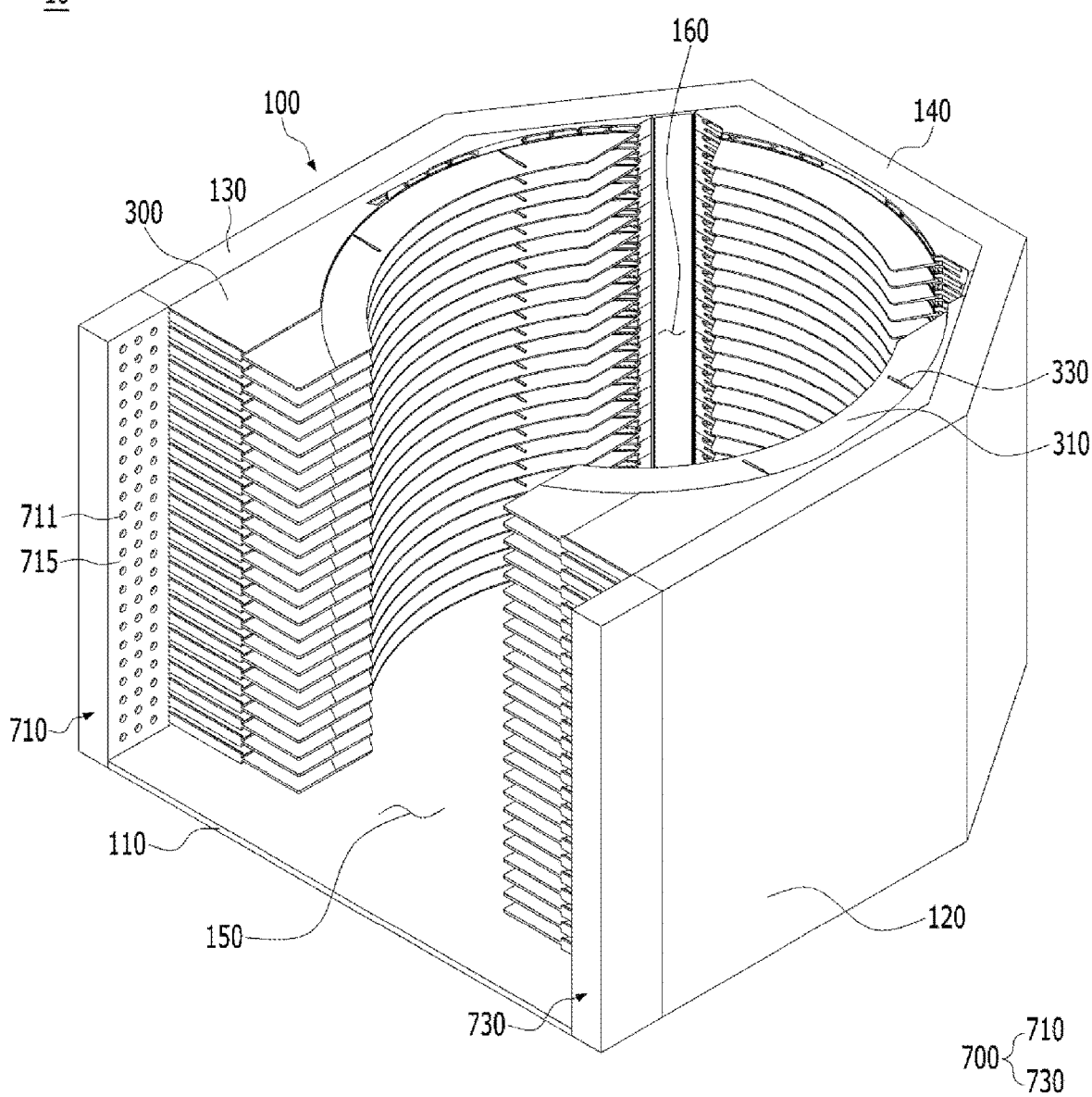
FIG. 1 is a perspective view of a wafer storage container according to a first preferred embodiment of the present disclosure.
Figure 1:
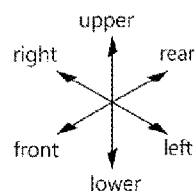

FIG. 1 is a perspective view of a wafer storage container according to a first preferred embodiment of the present disclosure; FIG. 2 is a view of the inside of a storage chamber of the wafer storage container of FIG. 1 viewed from the top; and FIG. 3 is a view showing flows of the first gas and the second gas in the wafer storage container of FIG. 1.

Figure 2:
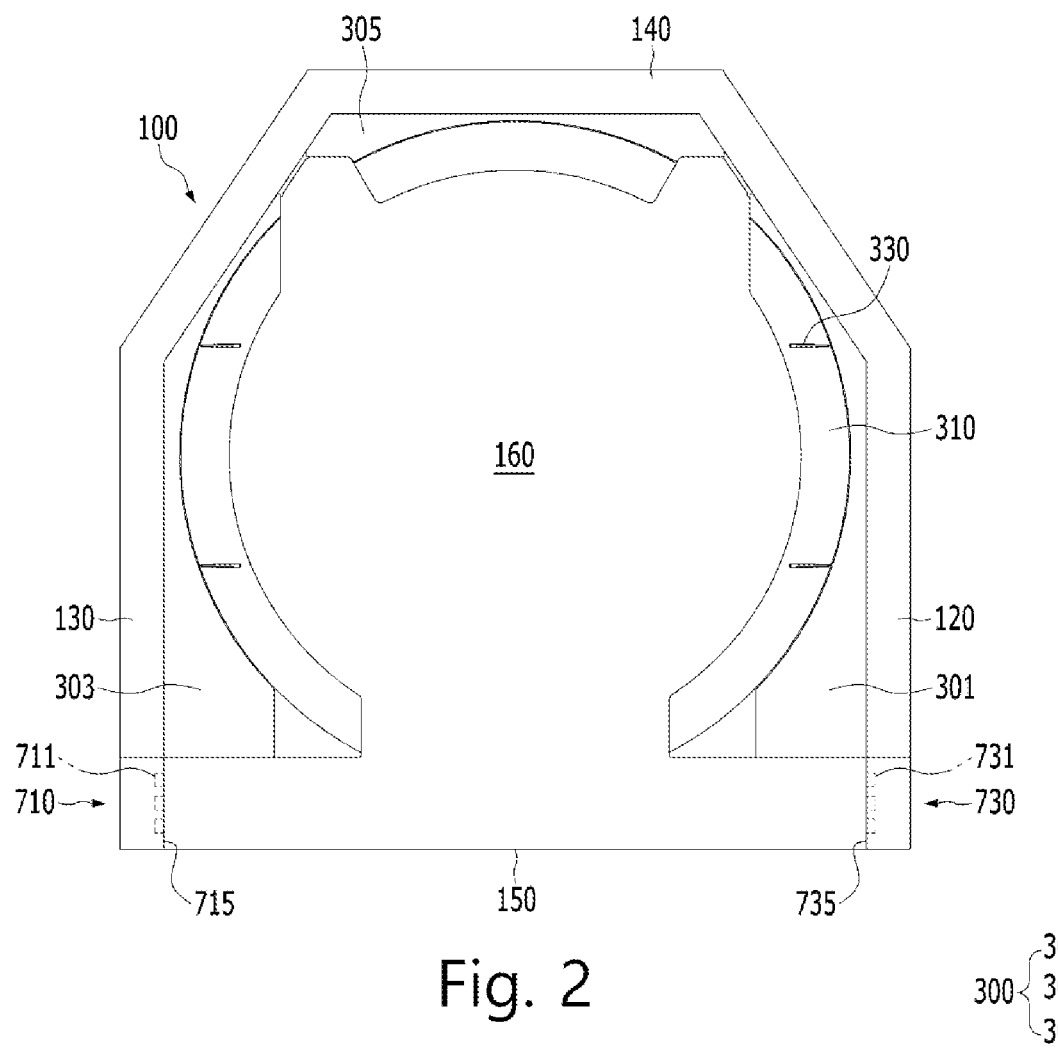
FIG. 2 is a view of the inside of a storage chamber of the wafer storage container of FIG. 1 viewed from the top.
Figure 3:
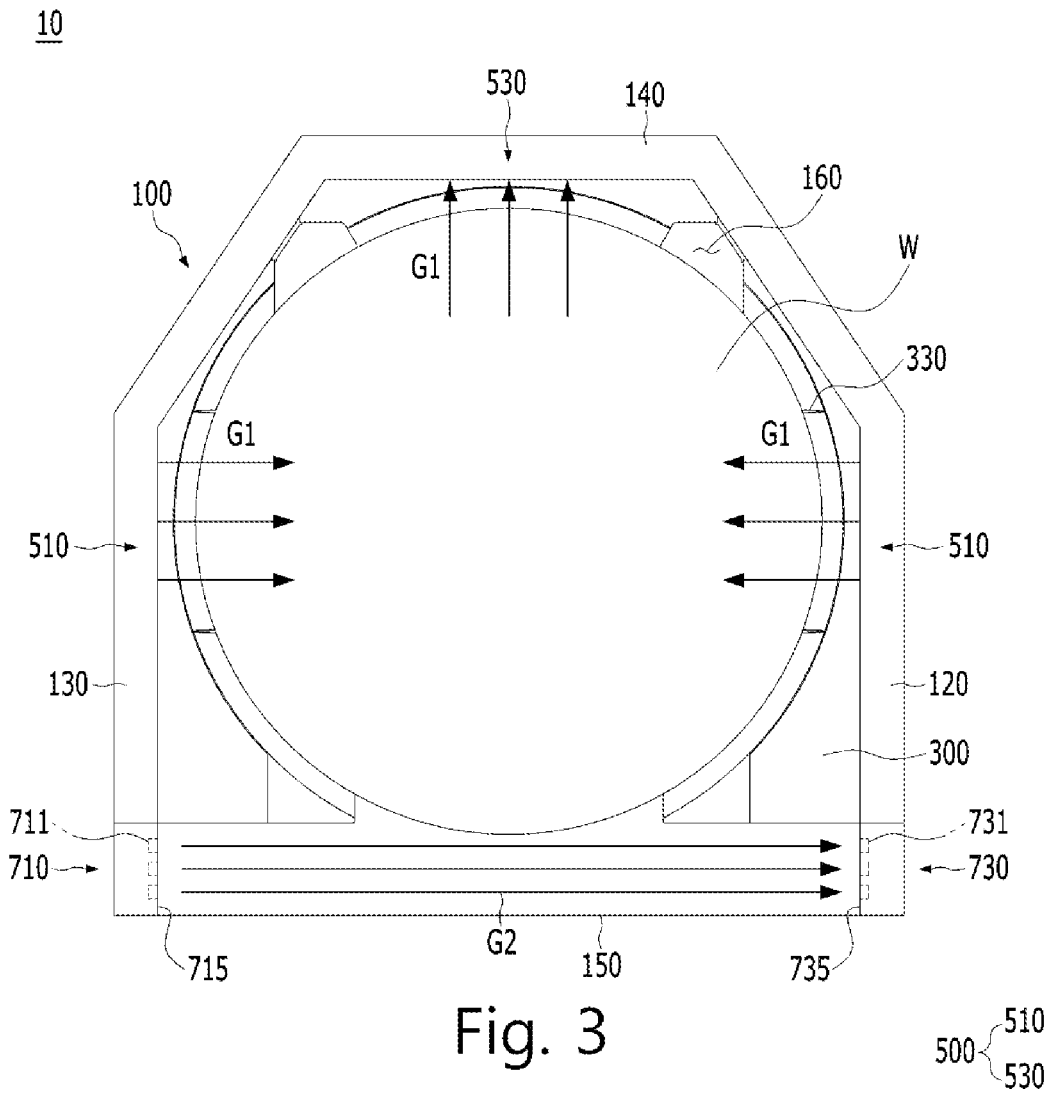
FIG. 3 is a view showing flows of the first gas and the second gas in the wafer storage container of FIG. 1.

As shown in FIGS. 1 to 3, the wafer storage container 10 according to the first preferred embodiment of the present disclosure is connected to an external chamber (not shown) and has a storage chamber 160 in which a wafer W received through a front opening 150 is accommodated.

The wafer storage container 10 may include: a main body 100 having a front opening 150 and a storage chamber 160; the storage chamber 160 in which the wafer W is accommodated through the external chamber (not shown) connected to the wafer storage container 10; a support 300 for supporting the wafer W; a fume removal unit 500 that injects a first gas G1 into the storage chamber and exhausts the first gas G1 to remove fumes from the wafer W; and an outside air blocking unit 700 that injects a second gas G2 from a first side of a side of the front opening 150 and exhausts the second gas G2 from a second side of the side of the front opening 150 to block the airflow of the external chamber from entering the storage chamber 160.

Hereinafter, the main body 100 will be described.

The main body 100 includes: an upper plate (not shown) that closes the upper part of the main body 100; a lower plate 110 that closes the lower part of the main body 100; a left outer wall 120 that closes the left side of the main body 100; a right outer wall 130 that closes the right side of the main body 100; and a rear outer wall 140 that closes the rear of the main body 100.

Due to the above configuration, the main body 100 has a shape in which the front is open, and the upper, lower, left, right, and rear surfaces are closed by the upper plate, the lower plate 110, the left outer wall 120, the right outer wall 130, and the rear outer wall 140.

The open front of the main body 100 forms the front opening 150, and a space surrounded by the upper plate, the lower plate 110, the left outer wall 120, the right outer wall 130, and the rear outer wall 140 forms the storage chamber 160.

Hereinafter, the storage chamber 160 will be described.

The storage chamber 160 is a space in which the wafer W is accommodated through the front opening 150 formed in the front of the wafer storage container 10.

When the wafer storage container 10 is connected to the external chamber, the storage chamber 160 communicates with the external chamber.

The external chamber may be a wafer transfer chamber of an equipment front end module (EFEM).

The wafer transfer chamber, that is, the external chamber, is equipped with a robot arm that transfers the wafer W. When the wafer storage container 10 is connected to the external chamber, the robot arm transfers the wafer W to the support 300 of the wafer storage container 10, and the wafer W is accommodated in the storage chamber 160 of the wafer storage container 10.

Hereinafter, the support 300 will be described.

The support 300 serves to support the wafer W, and is provided in the storage chamber 160 of the main body 100.

A plurality of supports 300 may be provided in the vertical direction according to the number of wafers W accommodated in the storage chamber 160.

For example, when 30 wafers W are accommodated in the storage chamber 160, 30 supports 300 supporting each of the 30 wafers W are provided.

In addition, each of the plurality of supports 300 is provided with a step 310 stepped downward so as to overlap a partial area in the outer direction of the wafer W, and the step 310 is provided with a protruding pin 330. Accordingly, the wafer W is seated on the protruding pin 330 and supported by the support 300.

As described above, since the wafer W is seated on the protruding pin 330 and supported by the support 300, the contact area between the wafer W and the support 300 may be minimized, and thus, damage to the wafer W by contact may be minimized.

The plurality of supports 300 may be configured to include: a left support 301 provided on the left side surface of the storage chamber 160; a right support 303 provided on the right side surface of the storage chamber 160; and a rear support 305 provided on the rear surface of the storage chamber 160.

The left support 301, the right support 303, and the rear support 305 may be coupled to each other by a support coupling part (not shown), and the upper and lower coupling of the plurality of supports 300 may also be made by the support coupling part.

Hereinafter, the fume removal unit 500 will be described.

The fume removal unit 500 is provided inside the storage chamber 160 of the main body 100.

The fume removal unit 500 functions to inject the first gas G1 into the storage chamber 160 and exhaust the injected first gas G1.

In this case, the first gas G1 may be an inert gas such as nitrogen, and the second gas G2 to be described later and the first gas G1 may be the same gas.

The fume removal unit 500 may be configured to include: a first gas injection part 510 for injecting the first gas G1; the first gas G1 injected by the first gas injection part 510; and a first gas exhaust part 530 for exhausting fumes inside the storage chamber 160 together with the first gas G1.

The first gas injection part 510 may be provided on at least one of the left side, the right side, and the rear side of the storage chamber 160. As an example in FIG. 3, it is shown that the first gas injection part 510 is provided on the left and right sides of the storage chamber 160.

The first gas injection part 510 is provided with a plurality of first gas injection ports on at least one of the left side, the right side, and the rear side surfaces of the storage chamber 160, so that the first gas G1 is injected through the plurality of first gas injection ports, and as a result, the injection may be done in the form of a surface injection in which the first gas G1 is injected from at least one of the left side, the right side, and the rear side surfaces, that is, from an entire surface.

In this case, the left side surface of the storage chamber 160 may be a left inner wall spaced apart from the inside of the left outer wall 120, the right side surface of the storage chamber 160 may be a right inner wall spaced apart from the inside of the right outer wall 130, and the rear side surface of the storage chamber 160 may be a rear inner wall spaced apart from the inside of the rear outer wall 140. Accordingly, the plurality of first gas injection ports may be provided on at least one of the left inner wall, the right inner wall, and the rear inner wall.

When the plurality of first gas injection ports are provided on the left inner wall, the first gas G1 is supplied through a left chamber formed between the left outer wall 120 and the left inner wall, then is injected through the plurality of first gas injection ports, so that the first gas G1 may be injected and supplied from the left side of the storage chamber 160 in the form of a surface injection.

When the plurality of first gas injection ports are provided on the right inner wall, the first gas G1 is supplied through a right chamber formed between the right outer wall 130 and the right inner wall, then is injected through the plurality of first gas injection ports, so that the first gas G1 may be injected and supplied from the right side of the storage chamber 160 in the form of a surface injection.

When the plurality of first gas injection ports are provided on the rear inner wall, the first gas G1 is supplied through a rear chamber formed between the rear outer wall 140 and the right inner wall, then is injected through the plurality of first gas injection ports, so that the first gas G1 may be injected and supplied from the rear side of the storage chamber 160 in the form of a surface injection.

As described above, when the main body 100 is provided with the left inner wall, the right inner wall, and the rear inner wall, the space surrounded by the left inner wall, the right inner wall, and the rear inner wall forms the storage chamber 160.

Unlike the above, the first gas injection part 510 may be formed of a separate injection nozzle. In this case, a plurality of first gas injection ports may be provided in the separate injection nozzle in the form of a line. In other words, the plurality of first gas injection ports may be arranged in a row form arranged in a vertical direction, or arranged in a column form arranged in a horizontal direction. The injection nozzle may be installed inside the storage chamber 160 so that the plurality of first gas injection ports are located between the plurality of supports 300 provided at the top and bottom. As such, when the first gas injection part 510 is formed of a separate injection nozzle, the first gas G1 is injected through a plurality of first gas injection ports provided in the injection nozzle, and thus, the first gas G1 may be injected in a linear injection form in which the first gas G1 is injected through a vertical or horizontal line.

Unlike the above, the first gas injection part 510 may have a plurality of first gas injection ports in the support 300, and as the first gas G1 is injected through the plurality of first gas injection ports provided in the support 300, the first gas G1 may be injected in the form in which the first gas G1 is injected from the support 300.

The first gas exhaust part 530 may be provided on at least one of the left side, the right side, and the rear side of the storage chamber 160. As an example in FIG. 3, it is shown that the first gas exhaust part 530 is provided at the rear side of the storage chamber 160.

The first gas exhaust part 530 is provided with a plurality of first gas exhaust ports on at least one of the left side, the right side, and the rear side surfaces of the storage chamber 160, so that the first gas G1 and fumes in the storage chamber 160 are exhausted through the plurality of first gas exhaust ports, and as a result, the exhaust may be done in the form of a surface exhaust in which the first gas G1 and the fumes in the storage chamber 160 are exhausted from at least one of the left side, the right side, and the rear side surfaces, that is, from an entire surface.

In this case, the left side surface of the storage chamber 160 may be the left inner wall spaced apart from the inside of the left outer wall 120, the right side surface of the storage chamber 160 may be the right inner wall spaced apart from the inside of the right outer wall 130, and the rear side surface of the storage chamber 160 may be the rear inner wall spaced apart from the inside of the rear outer wall 140. Accordingly, the plurality of first gas exhaust ports may be provided on at least one of the left inner wall, the right inner wall, and the rear inner wall.

When the plurality of first gas exhaust ports are provided on the left inner wall, the first gas G1 and the fumes are exhausted through the plurality of first gas exhaust ports on the left side of the storage chamber 160, flow through the left chamber formed between the left outer wall 120 and the left inner wall to be exhausted to the outside of the wafer storage container 10.

When the plurality of first gas exhaust ports are provided on the right inner wall, the first gas G1 and the fumes are exhausted through the plurality of first gas exhaust ports on the right side of the storage chamber 160, flow through the right chamber formed between the right outer wall 130 and the right inner wall to be exhausted to the outside of the wafer storage container 10.

When the plurality of first gas exhaust ports are provided on the rear inner wall, the first gas G1 and the fumes are exhausted through the plurality of first gas exhaust ports on the rear side of the storage chamber 160, flow through the rear chamber formed between the rear outer wall 140 and the rear inner wall to be exhausted to the outside of the wafer storage container 10.

The first gas exhaust part 530 may be formed of a separate injection nozzle. In this case, a plurality of first gas exhaust ports may be provided in the separate injection nozzle in the form of a line. In other words, the plurality of first gas exhaust ports may be arranged in a row form arranged in a vertical direction, or arranged in a column form arranged in a horizontal direction. The injection nozzle may be installed inside the storage chamber 160 so that the plurality of first gas exhaust ports are located between the plurality of supports 300 provided at the top and bottom. As such, when the first gas exhaust part 530 is formed of a separate injection nozzle, the first gas G1 is exhausted through a plurality of first gas exhaust ports provided in the injection nozzle, and thus, the first gas G1 may be exhausted in a linear exhaust form in which the first gas G1 is exhausted through a vertical or horizontal line.

The first gas exhaust part 530 may have a plurality of first gas exhaust ports in the support 300, and as the first gas G1 is exhausted through the plurality of first gas exhaust ports provided in the support 300, the first gas G1 may be exhausted in the form in which the first gas G1 is exhausted from the support 300.

The above-described first gas injection part 510 and the first gas exhaust part 530 of the fume removal unit 500 may be simultaneously provided on at least one of the left side, the right side, and the rear side surfaces of the storage chamber 160. For example, the first gas injection part 510 and the first gas exhaust part 530 may be simultaneously provided on the left side of the storage chamber 160, so that the injection of the first gas G1 through the first gas injection part 510 and the exhaust of the first gas G1 and the fumes inside the storage chamber 160 through the first gas exhaust part may be simultaneously performed on the left side of the storage chamber 160. Of course, even if the first gas injection part 510 and the first gas exhaust part 530 are provided on the same surface, only the injection of the first gas G1 may be performed, or only the exhaust of the first gas G1 and the fumes may be performed on the same surface by controlling the first gas injection part 510 and the first gas exhaust part 530 with a controller.

Hereinafter, the outside air blocking unit 700 will be described.

The outside air blocking unit 700 is provided outside the storage chamber 160 of the main body 100.

The outside air blocking unit 700 functions to inject the second gas G2 from one side of the side of the front opening 150 and exhaust the second gas G2 from the other side of the side of the front opening 150 in order to block the airflow of the external chamber from entering the storage chamber 160.

The outside air blocking unit 700 may be configured to include: a second gas injection nozzle 710 positioned in front of the support 300 and having a plurality of second gas injection ports 711 up and down for injecting the second gas G2; and a second gas exhaust nozzle 730 positioned in front of the support 300 and having a plurality of second gas exhaust ports 731 up and down for exhausting the second gas G2.

The second gas injection nozzle 710 is provided with a plurality of second gas injection ports 711 up and down. In this case, the plurality of second gas injection ports 711 provided up and down may be formed in the shape of a mattress having a plurality of rows. FIGS. 1 to 3, the shape in which the plurality of second gas injection ports 711 are arranged in three rows is shown as an example.

The second gas exhaust nozzle 730 is provided with a plurality of second gas exhaust ports 731 up and down. In this case, the plurality of second gas exhaust ports 731 provided up and down may be formed in the shape of a mattress having a plurality of rows. FIGS. 2 and 3, the shape in which the plurality of second gas exhaust ports 731 are arranged in three rows is shown as an example.

The second gas injection nozzle 710 is provided on one side of the side of the front opening 150. In this case, one side of the side of the front opening 150 may be the right side of the side of the front opening 150 as shown in FIGS. 1 to 3.

The second gas exhaust nozzle 730 is provided on the other side of the side of the front opening 150. In this case, the other side of the side of the front opening 150 may be the left side of the side of the front opening 150 as shown in FIG. 1.

In other words, the second gas injection nozzle 710 is provided on at least one of the left and right sides of the front of the wafer storage container 10, and the second gas exhaust nozzle 730 is provided on the other one in front of the wafer storage container 10.

In the second gas injection nozzle 710, the surface provided with the plurality of second gas injection ports 711 is an injection surface 715. This injection surface 715 may be one side of the side of the front opening 150. As an example in FIGS. 1 to 3, the injection surface 715 of the second gas injection nozzle 710 is the left side of the second gas injection nozzle 710, and the injection surface 715 is the right side of the side of the front opening 150.

In the second gas exhaust nozzle 730, the surface provided with the plurality of second gas exhaust ports 731 is an exhaust surface 735. This exhaust surface 735 may be the other side of the side of the front opening 150. As an example in FIGS. 2 and 3, the exhaust surface 735 of the second gas exhaust nozzle 730 is the right side of the second gas exhaust nozzle 730, and the exhaust surface 735 is the left side of the side of the front opening 150.

The above-described plurality of second gas injection ports 711 provided at upper and lower sides of the second gas injection nozzle 710 and the second gas exhaust ports 731 provided at upper and lower sides of the second gas exhaust nozzle 730 are preferably located between a plurality of supports 300 provided with one second gas injection port 711 and one second gas exhaust port 731 at the upper and lower sides, respectively.

This is because, as the second gas injection port 711 and the second gas exhaust port 731 are located between the plurality of supports 300, the second gas G2 is injected and exhausted from the front of the area where the wafers W are located, so that the flow of the second gas G2 from one side of the side of the front opening 150 to the other side is created, making it possible to effectively block the inflow of outside air into the area where the wafers W are located.

For the above-described plurality of second gas injection ports 711 provided at upper and lower sides of the second gas injection nozzle 710 and the second gas exhaust ports 731 provided at upper and lower sides of the second gas exhaust nozzle 730, the arrangement height of the plurality of second gas injection ports 711 and the arrangement height of the plurality of second gas exhaust ports 731 may be different from each other, so that when the second gas G2 injected from each of the plurality of second gas injection ports 711 is exhausted to each of the plurality of second gas exhaust ports 731, the second gas G2 is not horizontally injected and exhausted.

For example, when the second second gas injection port 711 from the bottom among the plurality of second gas injection ports 711 is arranged lower than the second second gas exhaust port 731 from the bottom among the plurality of second gas exhaust ports 731, the second gas G2 injected from the second second gas injection port 711 may be injected and exhausted in an inclined manner from the lower part to the upper part toward the second second gas exhaust port 731.

In addition, unlike the above, when the second second gas injection port 711 from the bottom among the plurality of second gas injection ports 711 is arranged higher than the second second gas exhaust port 731 from the bottom among the plurality of second gas exhaust ports 731, the second gas G2 injected from the second second gas injection port 711 may be injected and exhausted in an inclined manner from the upper part to the lower part toward the second second gas exhaust port 731.

As mentioned above, as the second gas G2 flowing from the plurality of second gas injection ports 711 to the plurality of second gas exhaust ports 731 flows obliquely from the lower part to the upper part, or flows obliquely from the upper part to the lower part, the flow of the second gas G2 is generated in a relatively larger area than when the second gas G2 flows in the horizontal direction, making it possible to more effectively block the outside air flowing in from the external chamber.

In other words, when the main flow path of the first gas G1 is formed in an inclined direction instead of in the horizontal direction, rather than when the main flow path of the first gas G1 is formed in the horizontal direction, the relative area of the main flow path of the first gas G1 may become wider, and thus, more effective blocking of the outside air may be achieved.

Hereinafter, an injection and exhaust process of the first gas G1 and the second gas G2 of the wafer storage container 10 according to the first embodiment of the present disclosure having the above-described configuration will be described.

First, the injection and exhaust process of the first gas G1 by the fume removal unit 500 will be described.

The injection and exhaust process of the first gas G1 by the fume removal unit 500 is to remove the fumes inside the storage chamber 160, and as shown in FIG. 3, the injection and exhaust process of the first gas G1 by the fume removal unit 500 is performed inside the storage chamber 160 of the main body 100.

The first gas injection part 510 of the fume removal unit 500 injects the first gas G1 from the left side surface and the right side surface of the storage chamber 160.

The first gas exhaust part 530 of the fume removal unit 500 exhausts the first gas G1 and the fumes from the rear side surface of the storage chamber 160.

In other words, the first gas G1 injected from the first gas injection ports of the first gas injection part 510 of the fume removal unit 500 is exhausted through the first gas exhaust ports of the first gas exhaust part 530 of the fume removal unit 500.

As such, as the first gas G1 is injected and exhausted inside the storage chamber 160, the fumes inside the storage chamber 160 may be easily removed.

The main flow path of the first gas G1 injected from the first gas injection part 510 of the fume removal unit 500 passes through at least one of the upper and lower surfaces of the wafer W supported by the support 300.

The main flow path of the first gas G1 and the fumes exhausted from the first gas exhaust part 530 of the fume removal unit 500 passes through at least one of the upper and lower surfaces of the wafer W supported by the support 300.

The main flow path of the first gas G1 means a path through which 70% or more of the flow rate of the first gas G1 flows.

As such, as the first gas G1 injected from the first gas injection part 510 of the fume removal unit 500 and the first gas G1 and the fumes exhausted from the first gas exhaust part 530 of the fume removal unit 500 pass through at least one of the upper and lower surfaces of the wafer W supported by the support 300, the fumes remaining on at least one of the upper and lower surfaces of the wafer W is exhausted to the first gas exhaust part 530 of the fume removal unit 500 together with the first gas G1, the fumes inside the storage chamber 160 may be easily removed.

Hereinafter, an injection and exhaust process of the second gas G2 by the outside air blocking unit 700 will be described.

The injection and exhaust process of the second gas G2 by the outside air blocking unit 700 is to block the airflow of the external chamber communicating with the storage chamber 160 of the main body 100 from entering the storage chamber 160, and as shown in FIG. 3, the injection and exhaust process of the second gas G2 by the outside air blocking unit 700 is performed outside the storage chamber 160 of the main body 100.

The second gas G2 is injected from the plurality of second gas injection ports 711 of the second gas injection nozzle 710 of the outside air blocking unit 700. In this case, the second gas G2 is injected from one side of the side of the front opening 150 to the other, that is, in the example of FIG. 3, the second gas G2 is injected from the right to the left of the side of the front opening 150.

The second gas G2 injected from the second gas injection nozzle 710 is exhausted from the plurality of second gas exhaust ports 731 of the second gas exhaust nozzle 730 of the outside air blocking unit 700. In this case, the second gas G2 is exhausted from one side of the side of the front opening 150 to the other, that is, in the example of FIG. 3, the second gas G2 is exhausted from the right to the left of the side of the front opening 150.

In other words, the second gas G2 injected from the second gas injection ports 711 of the second gas injection nozzle 710 of the outside air blocking unit 700 is exhausted through the first gas exhaust ports of the first gas exhaust part 530 of the fume removal unit 500.

As such, as the second gas G2 is injected and exhausted from the outside of the storage chamber 160, the second gas G2 is injected and exhausted from one side to the other side (i.e., from right to left) outside the storage chamber 160, and thus, the flow of the second gas G2 is generated outside the wafer storage container 10. Accordingly, due to the flow of the second gas G2, the wafer storage container 10 may effectively block the outside air flowing from the external chamber.

Since the outside air blocking unit 700 is located outside the storage chamber 160, the main flow path of the second gas G2 injected from the second gas injection nozzle 710 does not pass through the upper and lower surfaces of the wafer W supported on the support 300, and the main flow path of the second gas G2 exhausted through the second gas exhaust nozzle 730 also does not pass through the upper and lower surfaces of the wafer W supported by the support 300.

In other words, the second gas G2 injected and exhausted from the outside air blocking unit 700 is not injected and exhausted in the area where the wafer W is located in the storage chamber 160, but is only injected and exhausted from the outside of the storage chamber 160, so that the second gas G2 only functions to block the outside air of the external chamber from entering the storage chamber 160.

The main flow path of the second gas G2 means a path through which 70% or more of the flow rate of the second gas G2 flows.

The wafer storage container 10 according to the first preferred embodiment of the present disclosure having the above configuration has following effects.

Fumes remaining on a wafer W can be effectively removed by the fume removal unit 500, and outside air flowing into a storage chamber 160 can be blocked by the outside air blocking unit 700.

In addition, unlike the conventional wafer storage container that blocks the outside air by injecting and exhausting gas in the vertical direction, in the wafer storage container 10 according to the first preferred embodiment of the present disclosure, the second gas G2 flows in the horizontal direction (or a direction inclined from horizontal to upper or lower) to block the outside air, so that the blocking of the outside air is continuously made without interruption when a robot arm stores wafers W in the storage chamber 160.

In addition, in the conventional wafer storage container that blocks the outside air by injecting and exhausting gas in the vertical direction, the gas collides with the upper and lower surfaces of the wafer, so when the injection pressure of the gas is increased, the wafer may be shaken up and down, causing damage to the wafer. However, in the wafer storage container 10 according to the first preferred embodiment of the present disclosure, the second gas G2 flows in the horizontal direction (or a direction inclined from horizontal to upper or lower) to block the outside air, so, even if the injection pressure of the second gas G2 is increased in order to block the outside air with the stronger injection pressure of the second gas G2, damage to the wafer W can be minimized.

Wafer Storage Container 10' According to a Second Preferred Embodiment of the Present Disclosure Hereinafter, a wafer storage container 10' according to a second preferred embodiment of the present disclosure will be described with reference to FIG. 4.

Figure 4:
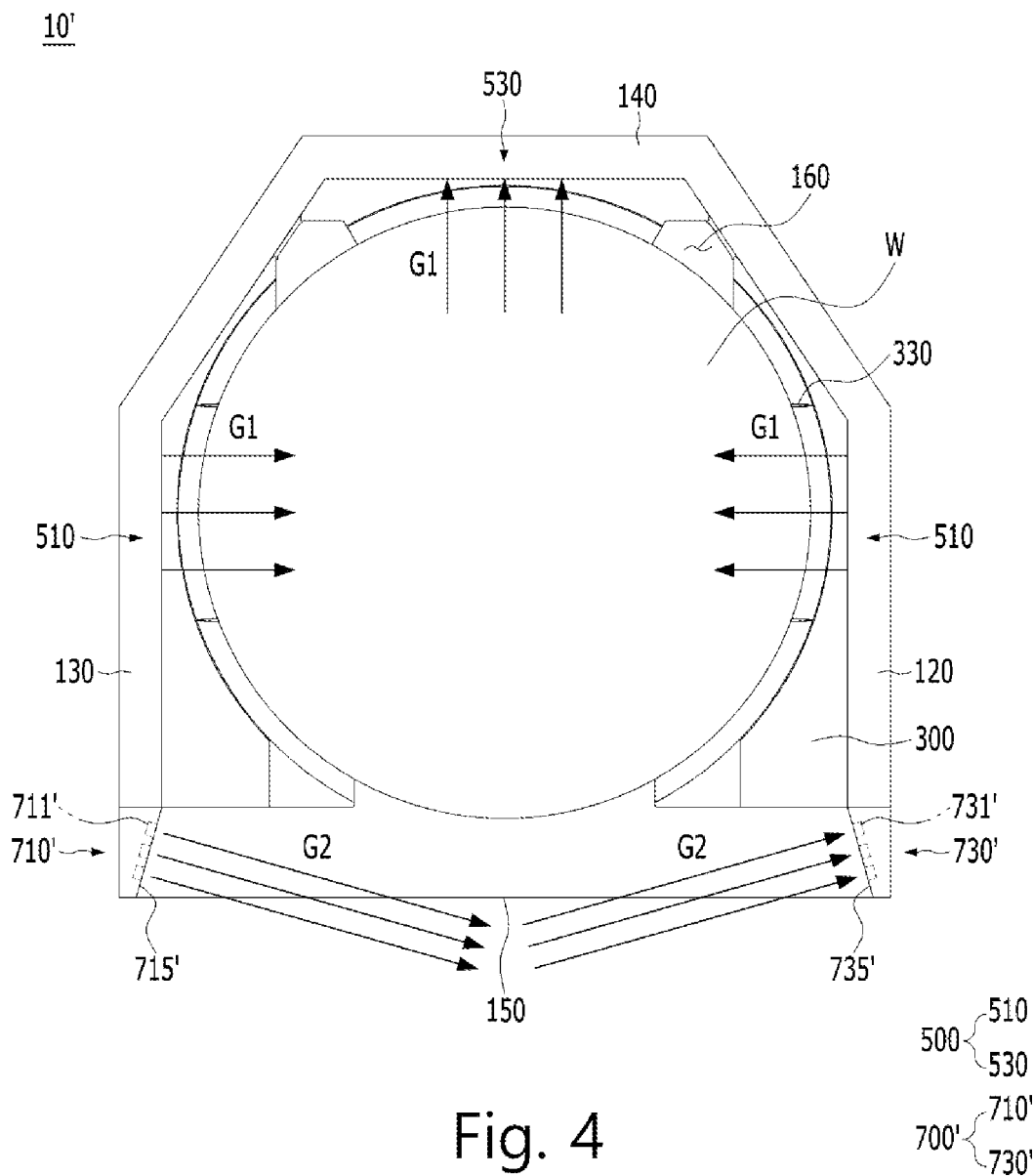
FIG. 4 is a view showing flows of the first gas and the second gas in a wafer storage container according to a second preferred embodiment of the present disclosure.

FIG. 4 is a view showing flows of the first gas and the second gas in a wafer storage container according to a second preferred embodiment of the present disclosure.

Compared with the wafer storage container 10 according to the first preferred embodiment of the present disclosure described above, in the wafer storage container 10' according to the second preferred embodiment of the present disclosure only the shapes of a second gas injection nozzle 710' and a second gas exhaust nozzle 730' of an outside air blocking unit 700' are different, and the remaining components are the same. Accordingly, the description of the remaining components may be replaced with the above description.

As shown in FIG. 4, the wafer storage container 10' according to the second preferred embodiment of the present disclosure may include: a main body 100 having a front opening 150 and a storage chamber 160; the storage chamber 160 in which a wafer W is accommodated through an external chamber connected to the wafer storage container 10; a support 300 for supporting the wafer W; a fume removal unit 500 that injects a first gas G1 into the storage chamber 160 and exhausts the first gas G1 to remove fumes of the wafer W; and an outside air blocking unit 700' that injects a second gas G2 from one side of the side of the front opening 150 and exhausts the second gas G2 from the other side of the side of the front opening 150 in order to block the airflow of the external chamber from entering the storage chamber 160.

The outside air blocking unit 700' may be configured to include: a second gas injection nozzle 710' positioned in front of the support 300 and having a plurality of second gas injection ports 711' up and down for injecting the second gas G2; and a second gas exhaust nozzle 730' positioned in front of the support 300 and having a plurality of second gas exhaust ports 731' up and down for exhausting the second gas G2.

One side of the side of the front opening 150 is an injection surface 713' provided with a plurality of second gas injection ports 711' in the second gas injection nozzle 710', and the injection surface 713' is inclined to one side of the wafer storage container 10' toward the front of the wafer storage container 10'.

In other words, the injection surface 713' of the second gas injection nozzle 710' is inclined to one side of the wafer storage container 10' toward the front of the wafer storage container 10'.

Accordingly, the second gas injection nozzle 710' of the outside air blocking unit 700' injects the second gas G2 obliquely so that the second gas G2 injected from the plurality of second gas injection ports 711' in the second gas injection nozzle 710' is directed toward the front of the wafer storage container 10' toward the other side of the side of the front opening.

As an example, as shown in FIG. 4, the case in which the second gas injection nozzle 710' is located on the right side of the wafer storage container 10' is as follows.

The right side of the side of the front opening 150 is an injection surface 713' provided with a plurality of second gas injection ports 711' in the second gas injection nozzle 710', and the injection surface 713' is formed to be inclined to the right side of the wafer storage container 10' toward the front of the wafer storage container 10'.

In other words, the injection surface 713' of the second gas injection nozzle 710' is inclined to the right side of the wafer storage container 10' toward the front of the wafer storage container 10'. In this case, the injection surface 713' is a left surface of the second gas injection nozzle 710', and the injection surface 713' has a shape facing toward the front left side of the wafer storage container 10'.

By having the configuration as above, the second gas injection nozzle 710' of the outside air blocking unit 700' obliquely injects the second gas G2, so that the second gas G2 injected from the plurality of second gas injection ports 711' of the second gas injection nozzle 710' is directed toward the front of the wafer storage container 10 toward the left side of the side of the front opening.

The other side of the side of the front opening 150 is an exhaust surface 733' provided with a plurality of second gas exhaust ports 731' in the second gas exhaust nozzle 730', and the exhaust surface 733' is formed to be inclined to the other side of the wafer storage container 10' toward the front of the wafer storage container 10'.

In other words, the exhaust surface 733' of the second gas exhaust nozzle 730' is inclined to the other side of the wafer storage container 10' toward the front of the wafer storage container 10'.

Accordingly, the second gas exhaust nozzle 730' of the outside air blocking unit 700' exhausts the second gas G2 obliquely so that the second gas G2 exhausted from the plurality of second gas exhaust ports 731' of the second gas exhaust nozzle 730' is directed toward the rear of the wafer storage container 10' toward the other side of the side of the front opening.

As an example, as shown in FIG. 4, the case in which the second gas exhaust nozzle 730' is located on the left side of the wafer storage container 10' is as follows.

The left side of the side of the front opening 150 is an exhaust surface 733' provided with a plurality of second gas exhaust ports 731' in the second gas exhaust nozzle 730', and the exhaust surface 733' is formed to be inclined to the left side of the wafer storage container 10' toward the front of the wafer storage container 10'.

In other words, the exhaust surface 733' of the second gas exhaust nozzle 730' is inclined to the left side of the wafer storage container 10' toward the front of the wafer storage container 10'. In this case, the exhaust surface 733' is a right surface of the second gas exhaust nozzle 730', and the exhaust surface 733' has a shape facing toward the front right side of the wafer storage container 10'.

By having the configuration as above, the second gas exhaust nozzle 730' of the outside air blocking unit 700' obliquely exhausts the second gas G2, so that the second gas G2 exhausted through the plurality of second gas exhaust ports 731' of the second gas exhaust nozzle 730' is directed toward the rear of the wafer storage container 10 toward the left side of the side of the front opening.

The wafer storage container 10' according to the second preferred embodiment of the present disclosure has following effects, in addition to the above-described effects of the wafer storage container 10 according to the first preferred embodiment of the present disclosure.

The injection surface 713' of the second gas injection nozzle 710' is inclined to one side of the wafer storage container 10' toward the front of the wafer storage container 10' and the exhaust surface 733' of the second gas exhaust nozzle 730' is inclined to the other side of the wafer storage container 10' toward the front of the wafer storage container 10', so that the second gas G2 is injected obliquely in the front direction of the wafer storage container 10' when injected through the second gas injection ports 711', and the second gas G2 is exhausted obliquely in the front direction of the wafer storage container 10' when exhausted through the second gas exhaust port 731'. Accordingly, the injection and exhaust of the second gas G2 to the outer area (or the front area) of the storage chamber 160, that is, to the outer area (front area) of the wafer storage container 10' are effectively performed, and thus, the inflow of outside air into the storage chamber 160 through the external chamber can be blocked more effectively.

In other words, since the second gas G2 is obliquely injected in the front direction of the wafer storage container 10', and is exhausted obliquely in the rear direction of the wafer storage container 10', when the wafer storage container 10' is connected to the external chamber, the second gas G2 is injected to a partial area inside the external chamber and then exhausted. Therefore, the inflow of the outside air inside the external chamber into the storage chamber 160 can be blocked more effectively.

In addition, by injecting the second gas G2 obliquely in the front direction of the wafer storage container 10', and obliquely exhausting the second gas G2 in the rear direction of the wafer storage container 10', it is possible to effectively inject and exhaust the second gas G2 through the outside air blocking unit 700' having a relatively smaller area than the outside air blocking unit 700 of the wafer storage container 10' according to the first preferred embodiment of the present disclosure, thereby achieving compactness of the wafer storage container.

Wafer Storage Container 10" According to a Third Preferred Embodiment of the Present Disclosure Hereinafter, a wafer storage container 10" according to a third preferred embodiment of the present disclosure will be described with reference to FIGS. 5 to 13.

Figure 5:
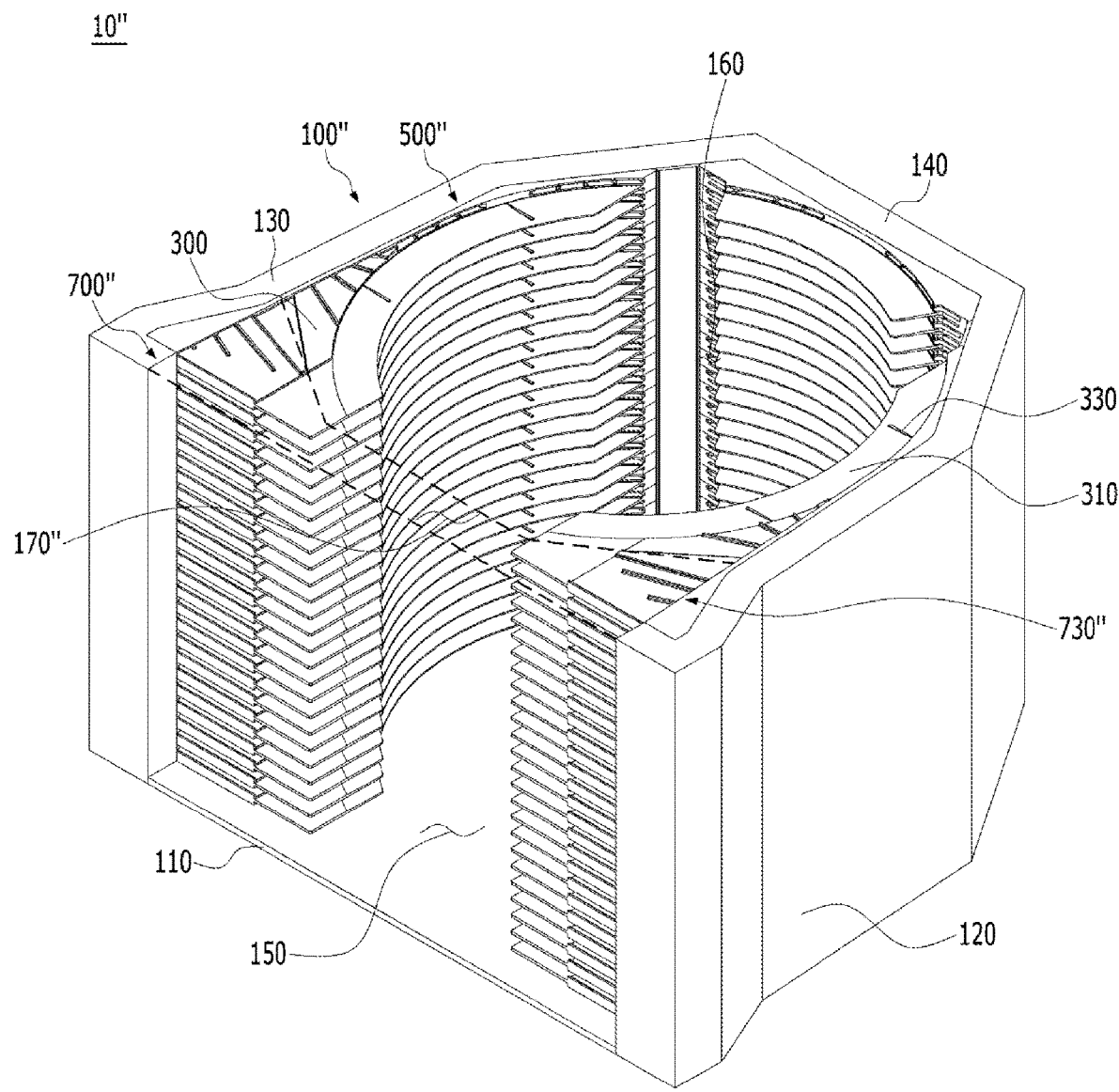
FIG. 5 is a perspective view of a wafer storage container according to a third preferred embodiment of the present disclosure.
Figure 5:
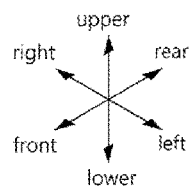
Figure 6:
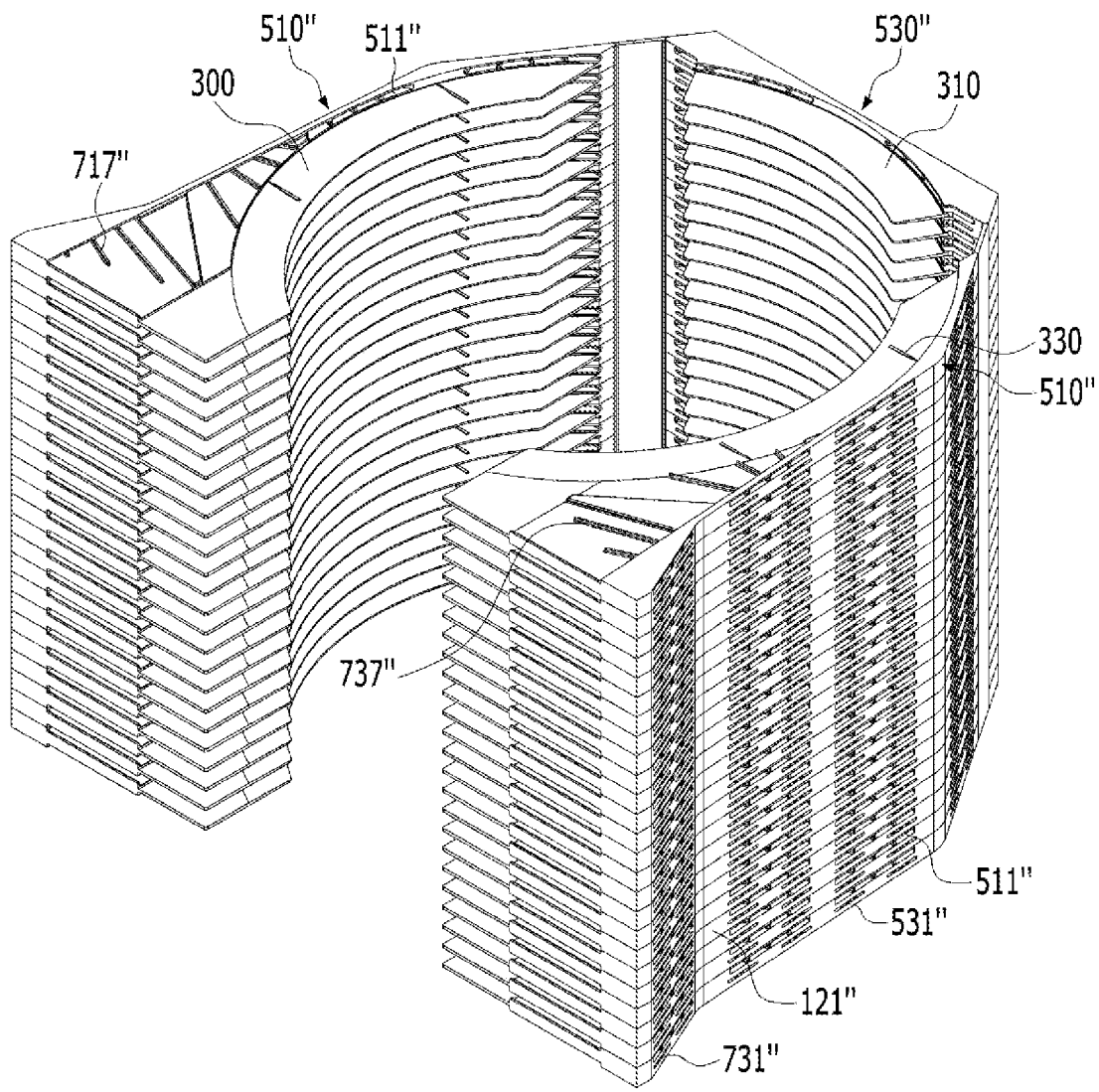
FIGS. 6 and 7 are perspective views showing a state in which an outer wall and a lower plate are removed from FIG. 5.
Figure 6:
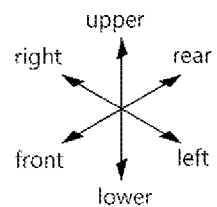
Figure 7:
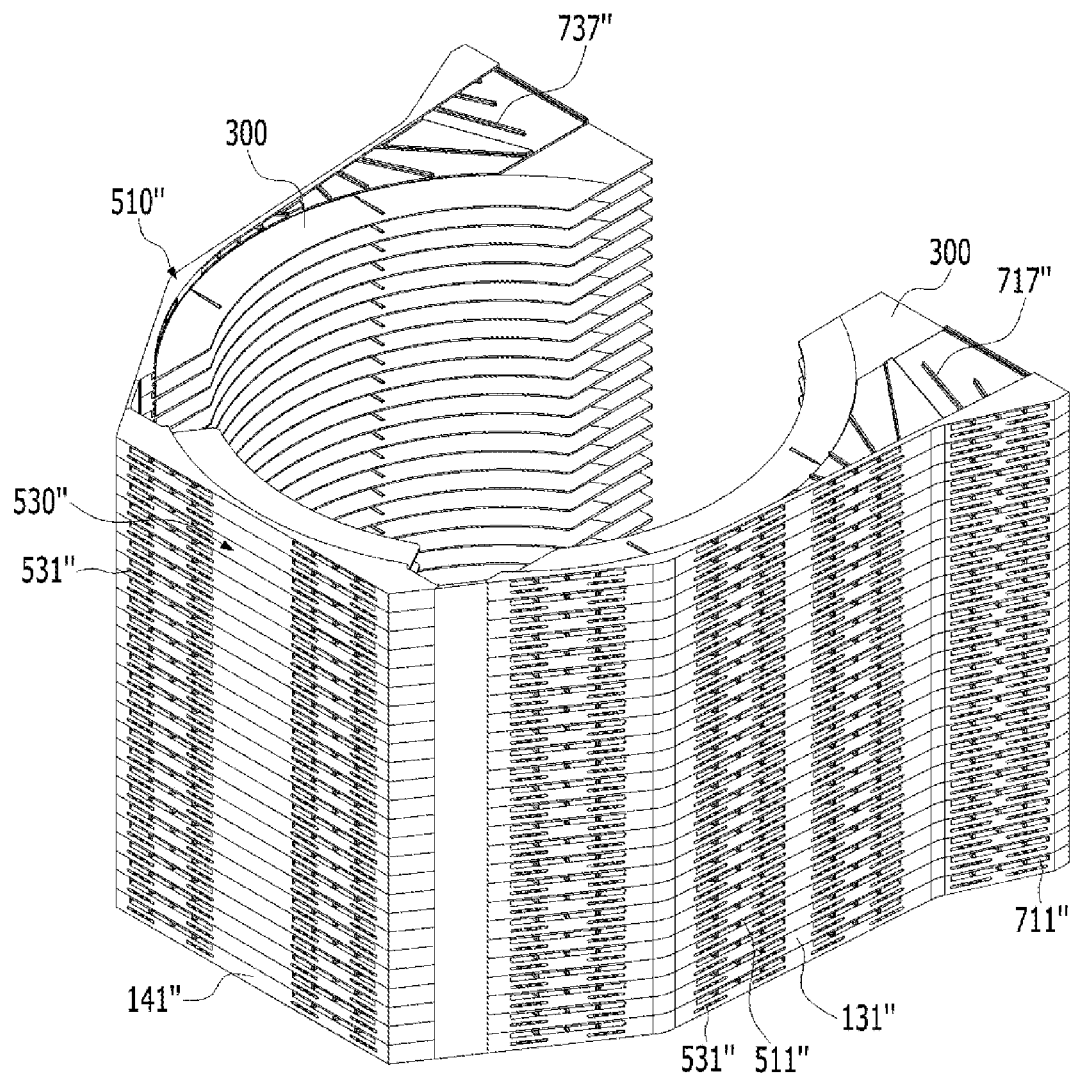
Figure 7:
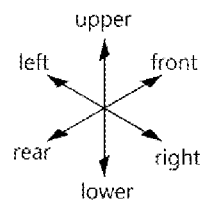
Figure 8:
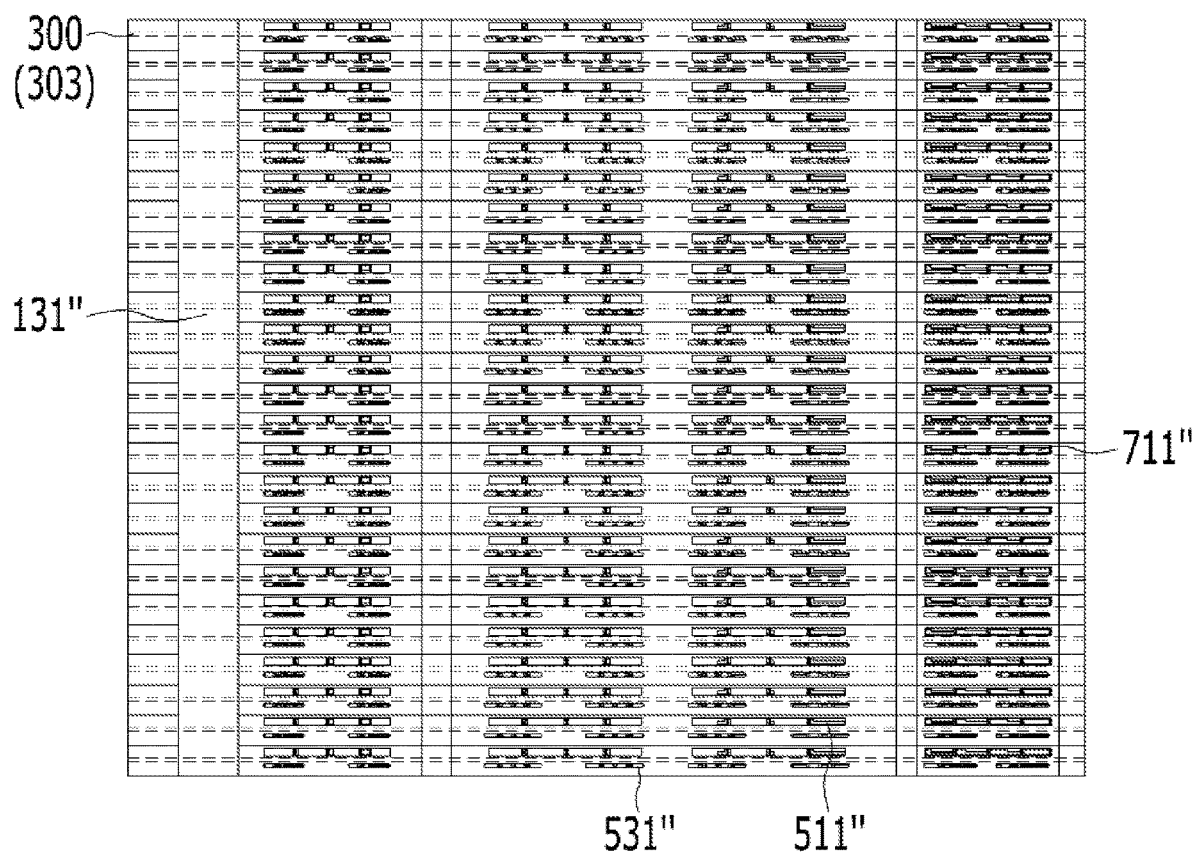
FIG. 8 is a view showing the right inner wall and a support of FIG. 5.
Figure 9:
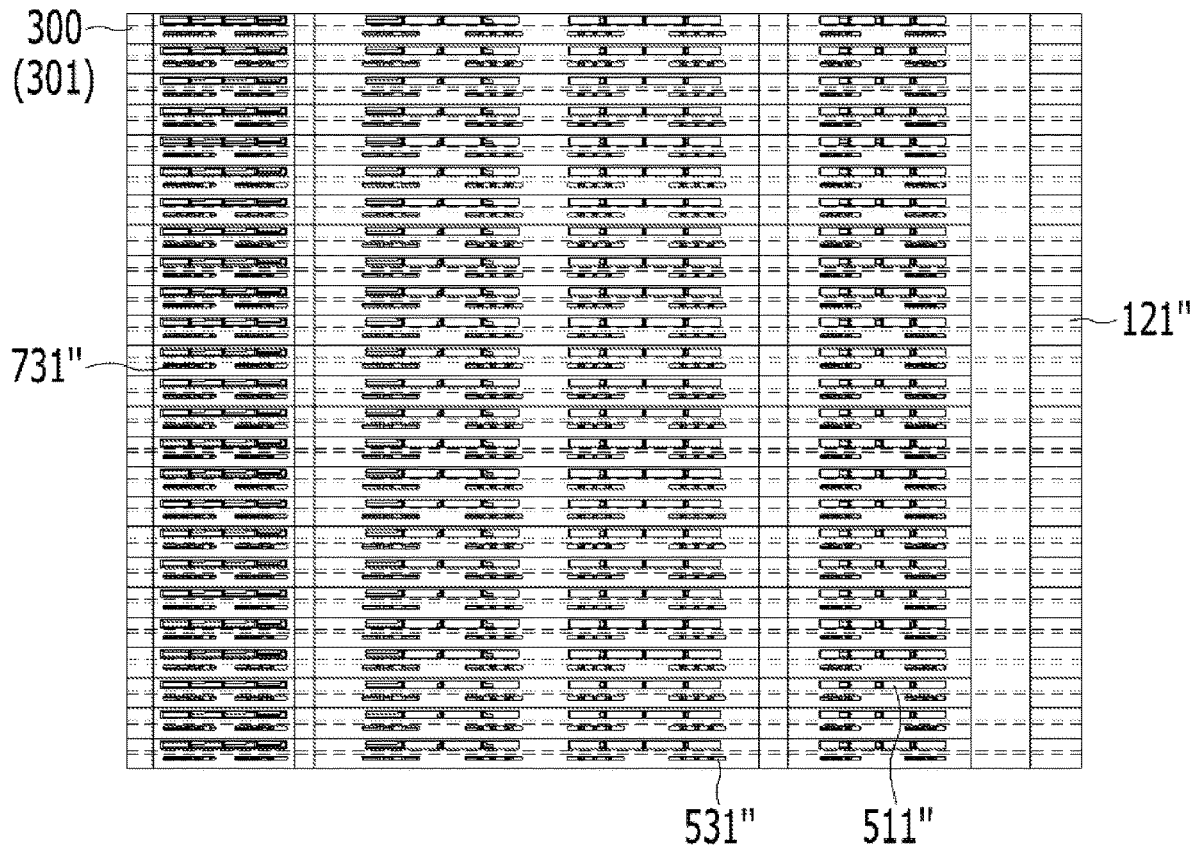
FIG. 9 is a view showing the left inner wall and the support of FIG. 5.
Figure 10:
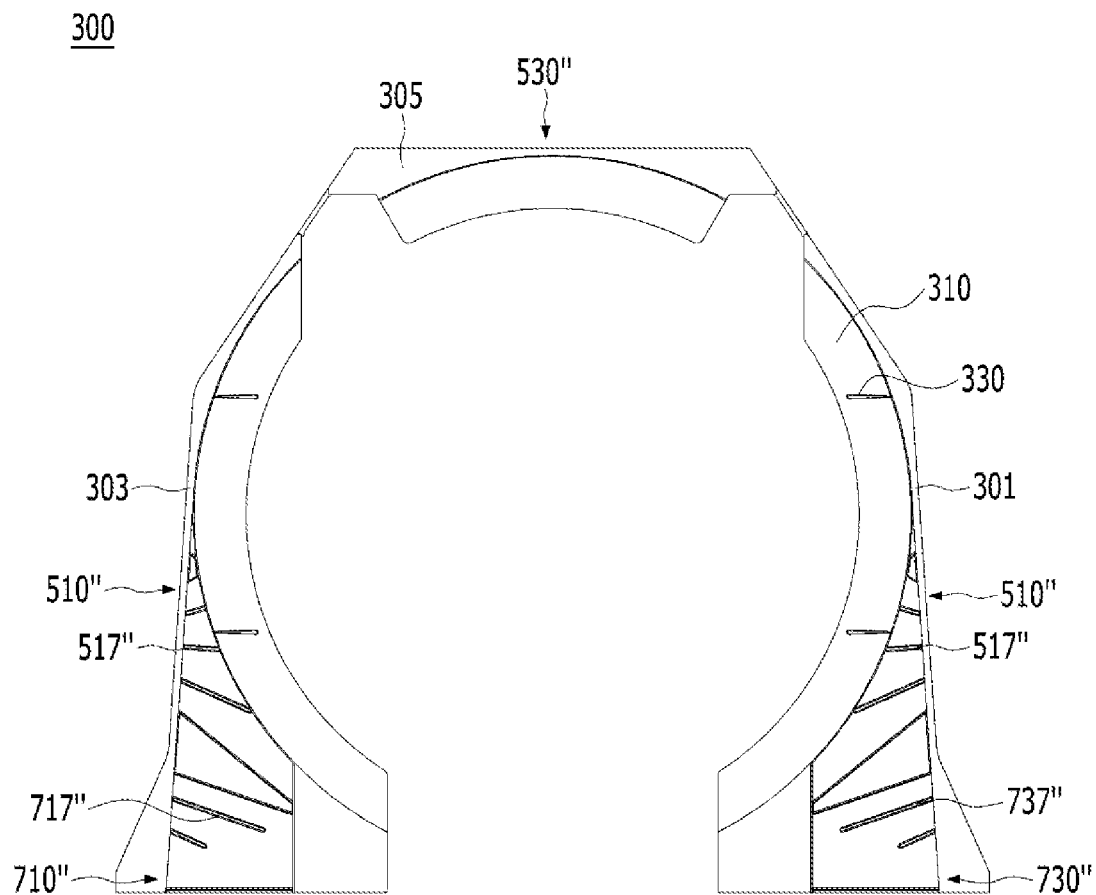
FIG. 10 is a plan view of the support of FIG. 5.
Figure 10:
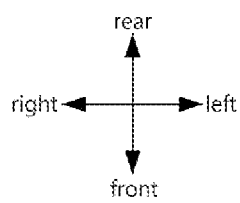
Figure 11:
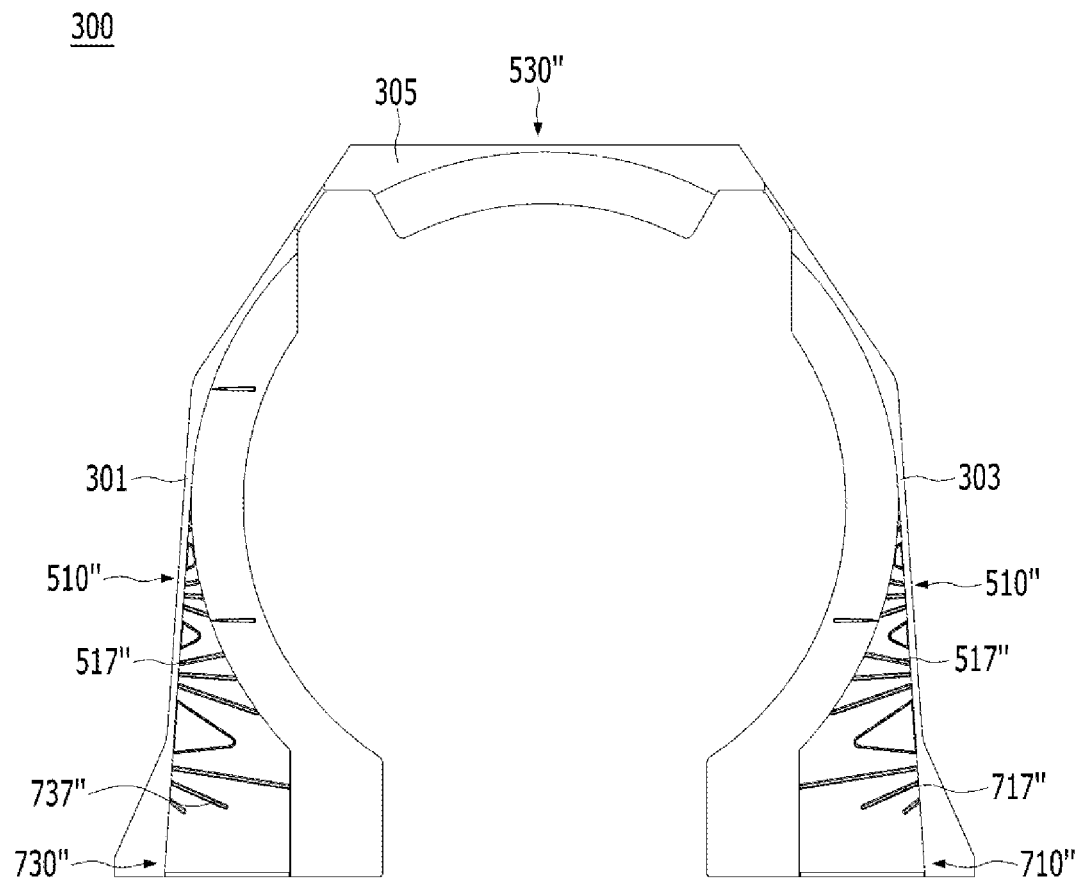
FIG. 11 is a bottom view of the support of FIG. 5.
Figure 11:
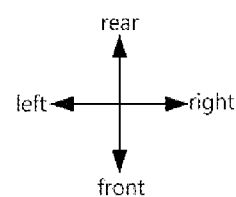
Figure 12:
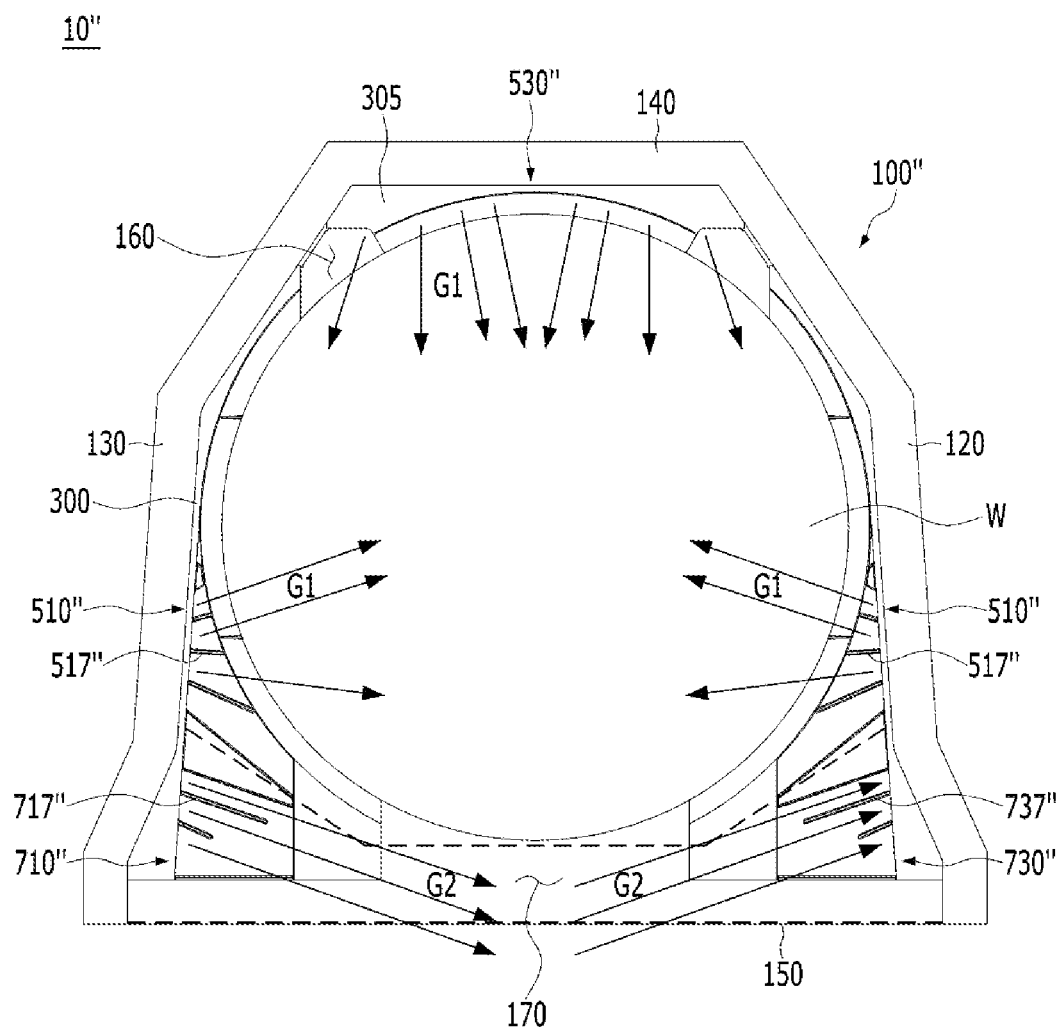
FIG. 12 is a view showing flows of the first gas and the second gas in the wafer storage container according to the third preferred embodiment of the present disclosure.
Figure 13:
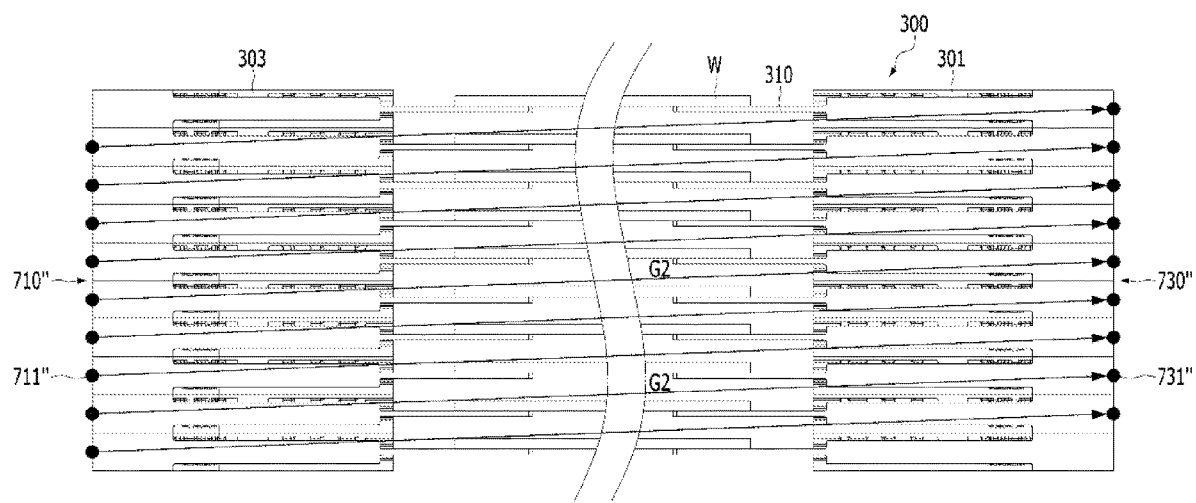
FIG. 13 is a view showing the flow of the second gas by an outside air blocking unit of the wafer storage container according to the third preferred embodiment of the present disclosure.

FIG. 5 is a perspective view of a wafer storage container according to a third preferred embodiment of the present disclosure; FIGS. 6 and 7 are perspective views showing a state in which an outer wall and a lower plate are removed from FIG. 5; FIG. 8 is a view showing the right inner wall and a support of FIG. 5; FIG. 9 is a view showing the left inner wall and the support of FIG. 5; FIG. 10 is a plan view of the support of FIG. 5; FIG. 11 is a bottom view of the support of FIG. 5; FIG. 12 is a view showing flows of the first gas and the second gas in the wafer storage container according to the third preferred embodiment of the present disclosure; and FIG. 13 is a view showing the flow of the second gas by an outside air blocking unit of the wafer storage container according to the third preferred embodiment of the present disclosure. As shown in FIGS. 5 to 13, the wafer storage container 10" according to the third preferred embodiment of the present disclosure is connected to an external chamber (not shown) and has a storage chamber 160 in which a wafer W received through a front opening 150 is accommodated.

The wafer storage container 10" may include: a main body 100" in which an area except for the front opening 150 is closed and having a front area 170" between the storage chamber 160 and the front opening 150; the storage chamber 160 in which a wafer W is accommodated through the external chamber (not shown) connected to the wafer storage container 10"; a support 300 for supporting the wafer W; a fume removal unit 500" that injects a first gas G1 into the storage chamber 160 and exhausts the first gas G1 to remove fumes of the wafer W; and an outside air blocking unit 700" that injects a second gas G2 from one side of the side of the front area 170" and exhausts the second gas G2 from the other side of the side of the front area 170" in order to block the airflow of the external chamber from entering the storage chamber 160.

Hereinafter, the main body 100" will be described.

The main body 100" includes: an upper plate (not shown) that closes the upper part of the main body 100"; a lower plate 110 that closes the lower part of the main body 100"; a left outer wall 120 that closes the left side of the main body 100"; a right outer wall 130 that closes the right side of the main body 100"; a rear outer wall 140 that closes the rear of the main body 100"; a left inner wall 121" spaced apart from the inside of the left outer wall 120; a right inner wall 131" spaced apart from the inside of the right outer wall 130; and a rear inner wall 141" spaced apart from the inside of the rear outer wall 140.

Due to the above configuration, the main body 100" has a shape in which the front is open, and the upper, lower, left, right, and rear side surfaces are closed by the upper plate, the lower plate 110, the left outer wall 120, the right outer wall 130, and the rear outer wall 140.

The open front of the main body 100" forms the front opening 150, and a space surrounded by the upper plate, the lower plate 110, the left inner wall 121", the right inner wall 131", and the rear inner wall 141" forms the front area 170" and the storage chamber 160.

The front area 170" is an area in front of the storage chamber 160 in which the wafer W is accommodated, and is an area where the wafer W is not located.

In other words, the storage chamber 160 is an area in which the wafer W is located in an internal space of the main body 100", and the front area 170" is an area where the wafer W is not located in the internal space of the main body 100", and is an area positioned in front of the storage chamber 160.

The front area 170" may be formed of an area having a shape different from that of the examples of FIGS. 5 and 12.

A space between the left outer wall 120 and the left inner wall 121" forms a left chamber.

A space between the right outer wall 130 and the right inner wall 131" forms a right chamber.

A space between the rear outer wall 140 and the rear inner wall 141" forms a rear chamber.

The first gas G1 and the second gas G2 may flow in the left chamber, the right chamber, and the rear chamber. Accordingly, injection and exhaust of the first gas G1 and injection and exhaust of the second gas G2 may be easily performed.

In addition, separate flow paths may be formed in the left chamber, the right chamber, and the rear chamber, so that the first gas G1 and the second gas G2 may flow.

The front area 170" refers to an area between the storage chamber 160 and the front opening 150 in the internal space of the main body 100".

Therefore, in the internal space of the main body 100", the front opening 150, the front area 170", and the storage chamber 160 are located in communication with each other in the direction from the front to the rear of the wafer storage container 10".

Hereinafter, the storage chamber 160 will be described.

The storage chamber 160 is a space in which the wafer W is accommodated through the front opening 150 and the front area 170" formed in the front of the wafer storage container 10".

When the wafer storage container 10" is connected to the external chamber, the storage chamber 160 and the front area 170" are in communication with the external chamber.

This external chamber may be a wafer transfer chamber of an equipment front end module (EFEM), and a description thereof will be omitted since it has been described above.

Hereinafter, the support 300 will be described.

The support 300 serves to support the wafer W, and is provided in the storage chamber 160 of the main body 100".

A plurality of supports 300 may be provided in the vertical direction according to the number of wafers W accommodated in the storage chamber 160.

For example, when 30 wafers W are accommodated in the storage chamber 160, 30 supports 300 supporting each of the 30 wafers W are provided.

In addition, each of the plurality of supports 300 is provided with a step 310 stepped downward so as to overlap a partial area in the outer direction of the wafer W, and the step 310 is provided with a protruding pin 330. Accordingly, the wafer W is seated on the protruding pin 330 and supported by the support 300.

As described above, since the wafer W is seated on the protruding pin 330 and supported by the support 300, the contact area between the wafer W and the support 300 may be minimized, and thus, damage to the wafer W by contact may be minimized.

The plurality of supports 300 may be configured to include: a left support 301 provided on the left side surface of the storage chamber 160; a right support 303 provided on the right side surface of the storage chamber 160; and a rear support 305 provided on the rear surface of the storage chamber 160.

The left support 301, the right support 303, and the rear support 305 may be coupled to each other by a support coupling part (not shown), and the upper and lower coupling of the plurality of supports 300 may also be made by the support coupling part.

Hereinafter, the fume removal unit 500" will be described.

The fume removal unit 500" functions to inject the first gas G1 into the storage chamber 160 and exhaust the injected first gas G1.

In this case, the first gas G1 may be an inert gas such as nitrogen, and the second gas G2 to be described later and the first gas G1 may be the same gas.

The fume removal unit 500" may be configured to include: a first gas injection port 511" provided on at least one of the left side, the right side, and the rear side surfaces of the storage chamber 160 to inject the first gas G1; and a first gas exhaust port 531" provided on at least one of the left side, right side, and rear side surfaces of the storage chamber 160 to exhaust the first gas G1 and the fumes inside the storage chamber 160 together.

In this case, the left side surface of the storage chamber 160 may be the left inner wall 121", the right side surface of the storage chamber 160 may be the right inner wall 131", and the rear side surface of the storage chamber 160 may be the rear inner wall 141".

Accordingly, the fume removal unit 500" may be configured to include: the first gas injection port 511" provided on at least one of the left inner wall 121", the right inner wall 131", and the rear inner wall 141" of the storage chamber 160 to inject the first gas G1; and the first gas exhaust port 531" provided on at least one of the left inner wall 121", the right inner wall 131", and the rear inner wall 141" of the storage chamber 160 to exhaust the first gas G1 and the fumes inside the storage chamber 160 together.

A plurality of the first gas injection port 511" and first gas exhaust port 531" may be provided. Each of the plurality of first gas injection ports 511" and the plurality of first gas exhaust ports 531" may be provided in plurality in the up-and-down direction, that is, in vertical direction and in horizontal direction.

As above, as the first gas injection port 511" is provided, the plurality of first gas injection ports 511" are provided on at least one of the left side, the right side, and the rear side surfaces of the storage chamber 160, so that the first gas G1 is injected through the plurality of first gas injection ports 511", and as a result, the injection may be done in the form of a surface injection in which the first gas G1 is injected from at least one of the left side, the right side, and the rear side surfaces, that is, from an entire surface.

As above, as the first gas exhaust port 531" is provided, the plurality of first gas exhaust ports 531" are provided on at least one of the left side, the right side, and the rear side surfaces of the storage chamber 160, so that the first gas G1 and the fumes are exhausted through the plurality of first gas exhaust ports 531", and as a result, the exhaust may be done in the form of a surface exhaust in which the first gas G1 and the fumes are exhausted from at least one of the left side, the right side, and the rear side surfaces, that is, from an entire surface.

In FIGS. 6 to 9, as an example, a plurality of first gas injection ports 511" are provided on the left side, the right side, and the rear side surfaces of the storage chamber 160, and a plurality of first gas exhaust ports 531" also are provided on the left side, the right side, and the rear side surfaces of the storage chamber 160. However, all of the first gas injection ports 511" and all the first gas exhaust ports 531" do not operate, and the injection of the plurality of first gas injection ports 511" and the exhaust of the first gas exhaust ports 531" may be selectively performed under the control of a controller.

For example, as shown in FIG. 12, the first gas G1 may be supplied only to and injected only from the plurality of first gas injection ports 511" provided on the left and right side surfaces of the storage chamber 160, so that the first gas G1 is injected from the left and right side surfaces of the storage chamber 160 and suction force is generated only at the plurality of first gas exhaust ports 531" provided on the rear side surface of the storage chamber 160, and thus, the first gas G1 and the fumes may be exhausted from the rear side surface of the storage chamber 160.

In other words, the first gas injection ports 511" and the first gas exhaust ports 531" of the fume removal unit 500" may be simultaneously provided on at least one of the left side, the right side, and the rear side surfaces of the storage chamber 160, so that the injection of the first gas G1 and the exhaust of the first gas G1 and the fumes inside the storage chamber 160 may be done at the same time from any one surface. Of course, even if the first gas injection ports 511" and the first gas exhaust ports 531" are provided on the same surface, only the injection of the first gas G1 or only the exhaust of the first gas G1 and the fumes may be performed on the same surface by controlling the supply and suction force of the first gas G1 of the first gas injection ports 511" and the first gas exhaust ports 531" with the controller.

When the first gas injection port 511" and the first gas exhaust port 531" are simultaneously provided on at least one of the left side, the right side, and the rear side surfaces of the storage chamber 160, the first gas injection port 511" and the first gas exhaust port 531" may have different heights. For example, as shown in FIGS. 6 to 9, a first gas exhaust port 531" may be positioned under the first gas injection port 511".

It is preferable that the plurality of first gas injection ports 511" and the plurality of first gas exhaust ports 531" are positioned between the plurality of supports 300 arranged up and down. This is to prevent the injection and exhaust of the first gas G1 from being blocked by the support 300.

At least on one of the upper and lower surfaces of the support 300, a first gas injection guide part 517" that guides the first gas G1 so that the first gas G1 injected from the first gas injection port 511" is directed toward the center of the wafer W may be provided.

The first gas injection guide part 517" is provided on at least one of the upper and lower surfaces of the left support 301 when the first gas injection port 511" is provided on the left inner wall 121".

The first gas injection guide part 517" provided on the upper surface of the left support 301 is formed to protrude upward, and is formed to be inclined to the center of the wafer W. Accordingly, the first gas G1 may be guided toward the center of the wafer W.

The first gas injection guide part 517″ provided on the lower surface of the left support 301 is formed to protrude downward, and is formed to be inclined to the center of the wafer W. Accordingly, the first gas G1 may be guided toward the center of the wafer W.

In addition, when the first gas injection port 511″ is provided on the right inner wall 131″, the first gas injection guide part 517″ is provided on at least one of the upper surface and the lower surface of the right support 303, and when the first gas injection port 511″ is provided on the rear inner wall 141″, the first gas injection guide part 517″ is provided on at least one of the upper surface and the lower surface of the rear support 303.

The first gas injection guide part 517″ provided on the upper surface of the right support 303 is formed to protrude upward, is formed to be inclined to the center of the wafer W. Accordingly, the first gas G1 may be guided toward the center of the wafer W.

The first gas injection guide part 517″ provided on the lower surface of the right support 303 is formed to protrude downward, is formed to be inclined to the center of the wafer W. Accordingly, the first gas G1 may be guided toward the center of the wafer W.

A plurality of the first gas injection guide parts 517″ described above may be provided in the horizontal direction, one more than the number of first gas injection ports 511″ provided in plurality in the horizontal direction. In other words, when the number of first gas injection ports 511″ is "n", the number of first gas injection guide parts 517″ is "n+1". As described above, as the number of the first gas injection ports 511″ and the first gas injection guide parts 517″ is set, the first gas injection guide parts 517″ may easily guide the first gas G1 injected from the first gas injection ports 511″.

Hereinafter, the outside air blocking unit 700″ will be described.

The outside air blocking unit 700″ functions to inject the second gas G2 from one side of the front area 170″ and exhaust the second gas G2 from the other side of the front area 170″ in order to block the airflow of the external chamber from entering the storage chamber 160.

The outside air blocking unit 700″ may be configured to include: a second gas injection port 711″ provided on one side surface of the front area 170″ to inject the second gas G2; and a second gas exhaust port 731″ provided on the other side surface of the front area 170″ to exhaust the second gas G2; a second gas injection guide part 717″ guiding the second gas G2 so that the second gas G2 injected from the second gas injection port 711″ is directed toward the front of the wafer storage container 10″ toward the other side of the front area 170″, and provided on at least one of the upper surface of one side of the front of the support 300 and the lower surface of one side of the front of the support 300; and a second gas exhaust guide part 737″ guiding the second gas G2 so that the second gas G2 exhausted from the second gas exhaust port 731″ is directed toward the rear of the wafer storage container 10″ toward the other side of the front area 170″, and provided on at least one of the upper surface of the other side of the front of the support 300 and the lower surface of the other side of the front of the support 300.

In the third embodiment, as an example, it is shown that the second gas injection port 711″ is provided on the right side surface of the front area 170″, and the second gas exhaust port 731″ is provided on the left side surface of the front area 170″. Therefore, the following description will be made on the basis of this.

The second gas injection port 711″ is provided on the right side surface of the front area 170″. Accordingly, the second gas injection port 711″ may be provided on the right inner wall 131″ of the main body 100″. A plurality of the second gas injection ports 711″ may be provided on the right inner wall 131″ up and down. In addition, a plurality of second gas injection ports 711″ may be provided in the horizontal direction.

As the second gas injection ports 711″ are provided on the right inner wall 131″, the second gas injection guide part 717″ is preferably provided on at least one of the upper surface of the front right side of the support 300 and the lower surface of the front right side of the support 300 in order to effectively guide the second gas G2 injected from the second gas injection ports 711″.

In the third embodiment, the second gas injection guide part 717″ is provided on the front right side of the support 300, that is, on both the upper and lower surfaces of the front of the right support 303.

The second gas injection guide part 717″ may be provided in plurality in the horizontal direction, and is formed to be inclined to face the front of the wafer storage container 10″ as going from one side (or the right side) of the wafer storage container 10″ (or the front area 170″) to the other side (or the left side). Accordingly, as shown in FIG. 12, when the second gas G2 is guided along the second gas injection guide part 717″, the second gas G2 is injected toward the front of the wafer storage container 10″ as going from one side (or the right side) to the other side (or the left side) of the wafer storage container 10″ (or the front area 170″).

The second gas injection guide part 717″ provided on the upper surface of the right support 303 is formed to protrude upward, and is inclined in the front direction of the wafer storage container 10″. Accordingly, the second gas injection guide part 717″ may easily guide the second gas G2 to the front area 170″.

The second gas injection guide part 717″ provided on the lower surface of the right support 303 is formed to protrude downward, and is inclined in the front direction of the wafer storage container 10″. Accordingly, the second gas injection guide part 717″ may easily guide the second gas G2 to the front area 170″.

A plurality of the second gas injection guide parts 717″ may be provided in the horizontal direction, one more than the number of second gas injection ports 711″ provided in plurality in the horizontal direction. In other words, when the number of second gas injection ports 711″ is "n", the number of second gas injection guide parts 717″ is "n+1". As described above, as the number of the second gas injection ports 711″ and the second gas injection guide parts 717″ is set, the second gas injection guide parts 717″ may easily guide the second gas G2 injected from the second gas injection ports 711″.

The second gas exhaust port 731″ is provided on the left side surface of the front area 170″. Accordingly, the second gas exhaust port 731″ may be provided on the left inner wall 121″ of the main body 100″. A plurality of the second gas exhaust ports 731″ may be provided on the left inner wall 121″ up and down. In addition, a plurality of second gas exhaust ports 731″ may be provided in the horizontal direction.

As the second gas exhaust ports 731″ are provided on the left inner wall 121″, the second gas exhaust guide part 737″ is preferably provided on at least one of the upper surface of the front left side of the support 300 and the lower surface of the front left side of the support 300 in order to effectively guide the second gas G2 injected from the second gas exhaust ports 731".

In the third embodiment, the second gas exhaust guide part 737" is provided on the front left side of the support 300, that is, on both the upper and lower surfaces of the front of the left support 301.

The second gas exhaust guide part 737" may be provided in plurality in the horizontal direction, and is formed to be inclined to face the rear of the wafer storage container 10" as going from one side (or the right side) of the wafer storage container 10" (or the front area 170") to the other side (or the left side). Accordingly, as shown in FIG. 12, when the second gas G2 is guided along the second gas injection guide part 717", the second gas G2 is exhausted toward the rear of the wafer storage container 10" as going from one side (or the right side) to the other side (or the left side) of the wafer storage container 10" (or the front area 170").

The second gas exhaust guide part 737" provided on the upper surface of the left support 301 is formed to protrude upward, and is inclined in the front direction of the wafer storage container 10". Accordingly, when the second gas G2 is exhausted, the second gas exhaust guide part 737" may easily guide the second gas G2 of the front area 170".

The second gas exhaust guide part 737" provided on the lower surface of the left support 301 is formed to protrude downward, and is inclined in the front direction of the wafer storage container 10". Accordingly, when the second gas G2 is exhausted, the second gas exhaust guide part 737" may easily guide the second gas G2 of the front area 170".

A plurality of the second gas exhaust guide parts 737" may be provided in the horizontal direction, one more than the number of second gas exhaust ports 731" provided in plurality in the horizontal direction. In other words, when the number of second gas exhaust ports 731" is "n", the number of second gas exhaust guide parts 737" is "n+1". As described above, as the number of the second gas exhaust ports 731" and the second gas exhaust guide parts 737" is set, the second gas exhaust guide parts 737" may easily guide the second gas G2 exhausted from the second gas exhaust ports 731".

Each of the plurality of second gas injection ports 711" provided up and down and each of the plurality of second gas exhaust ports 731" provided up and down are preferably located between the plurality of supports 300 having one second gas injection port 711" and second gas exhaust port 731" provided up and down.

This is because, as the second gas injection port 711" is located between the plurality of supports 300, the injection of the second gas G2 is done in the front of the area where the wafer W is located, so that the flow of the second gas G2 is generated from one side of the front area 170" to the other side, and thus, it is possible to effectively block the inflow of outside air into the area where the wafer W is located.

Hereinafter, an injection and exhaust process of the first gas G1 and the second gas G2 of the wafer storage container 10" according to the third preferred embodiment of the present disclosure having the above-described configuration will be described.

First, an injection and exhaust process of the first gas G1 by the fume removal unit 500" will be described.

The injection and exhaust process of the first gas G1 by the fume removal unit 500" is a process for removing the fumes inside the storage chamber 160, and as shown in FIG. 12, the injection and exhaust process of the first gas G1 by the fume removal unit 500" is performed inside the storage chamber 160 of the main body 100".

The first gas injection part 510 of the fume removal unit 500" injects the first gas G1 from the left and right side surfaces of the storage chamber 160 through the first gas injection port 511".

The first gas exhaust part 530 of the fume removal unit 500" exhausts the first gas G1 and fumes from the rear surface of the storage chamber 160 through the first gas exhaust port 531".

As such, as the first gas G1 is injected and exhausted inside the storage chamber 160, the fumes inside the storage chamber 160 may be easily removed.

The first gas G1 injected from the first gas injection part 510 of the fume removal unit 500" passes through at least one of the upper and lower surfaces of the wafer W.

The first gas G1 and the fumes exhausted through the first gas exhaust part 530 of the fume removal unit 500" pass through at least one of the upper and lower surfaces of the wafer W.

As such, as the first gas G1 injected from the first gas injection part 510 of the fume removal unit 500" and the first gas G1 and the fumes exhausted through the first gas exhaust part 530 pass through at least one of the upper and lower surfaces of the wafer W, the fumes remaining on at least one of the upper and lower surfaces of the wafer W is exhausted to the first gas exhaust part 530 of the fume removal unit 500" together with the first gas G1, so that the fumes inside the storage chamber 160 may be easily removed.

Hereinafter, an injection and exhaust process of the second gas G2 by the outside air blocking unit 700" will be described.

The injection and exhaust process of the second gas G2 by the outside air blocking unit 700" is a process for blocking the airflow of the external chamber communicating with the storage chamber 160 and the front area 170" of the main body 100" from entering the storage chamber 160, and as shown in FIG. 12, the injection and exhaust process of the second gas G2 by the outside air blocking unit 700" is performed in front of the storage chamber 160 of the main body 100", that is, in the front area 170".

The second gas G2 is injected from the plurality of second gas injection ports 711" of the outside air blocking unit 700". In this case, the second gas G2 is injected from one side to the other side of the front area 170", that is, from the right to the left side of the front area 170".

In addition, as described above, the second gas G2 is guided by the second gas injection guide part 717" and is injected obliquely to face the front of the wafer storage container 10" from one side of the front area 170" to the other side, that is, from the right to the left side of the front area 170".

The second gas G2 injected from the plurality of second gas injection ports 711" is exhausted from the plurality of second gas exhaust ports 731" of the outside air blocking unit 700". In this case, the second gas G2 is injected from one side of the front area 170" to the other side, that is, from the right to the left side of the front area 170". In this case, the second gas G2 is exhausted from one side to the other side of the front area 170", that is, from the right to the left side of the front area 170".

In addition, as described above, the second gas G2 is guided by the second gas exhaust guide parts 737" and is exhausted obliquely to face the rear of the wafer storage container 10" from one side of the front area 170" to the other side, that is, from the right to the left side of the front area 170".

As such, as the second gas G2 is injected and exhausted in the front area 170", which is the front of the storage chamber 160, the second gas G2 is injected and exhausted from one side to the other side (i.e., from right to left) in the front area 170", so that a flow of the second gas G2 is generated outside the storage chamber 160. Accordingly, the wafer storage container 10" may effectively block the outside air flowing from the external chamber through the flow of the second gas G2.

Since the outside air blocking unit 700" is injected and exhausted the second gas G2 in the front area 170", the main flow path of the second gas G2 injected from the second gas injection ports 711" does not pass through the upper and lower surfaces of the wafer W supported on the support 300, and the main flow path of the second gas G2 exhausted from the second gas exhaust ports 731" also does not pass through the upper and lower surfaces of the wafer W supported on the support 300.

In other words, the second gas G2 injected and exhausted from the outside air blocking unit 700" is not injected and exhausted in the area where the wafer W is located (i.e., in the storage chamber 160), but is injected and exhausted in the area other than the storage chamber 160 (in the front area 170"), so that the second gas G2 only functions to block the outside air of the external chamber from entering the storage chamber 160.

The main flow path of the second gas G2 means a path through which 70% or more of the flow rate of the second gas G2 flows.

A plurality of second gas injection ports 711" provided up and down on one side (or the right side) of the front area 170", that is, on the right inner wall 131" and a plurality of second gas exhaust ports 731" provided up and down on the other side (or the left side) of the front area 170", that is, on the left inner wall 121" may be provided with different arrangement heights, so that the second gas G2 is not horizontally injected and exhausted when the second gas G2 injected from each of the plurality of second gas injection ports 711" is exhausted to each of the plurality of second gas exhaust ports 731".

For example, as shown in FIG. 13, when the second second gas injection port 711" from the bottom among the plurality of second gas injection ports 711" is arranged lower than the second second gas exhaust port 731" from the bottom among the plurality of second gas exhaust ports 731", the second gas G2 injected from the second second gas injection port 711" may be injected and exhausted in an inclined manner from the lower part to the upper part toward the second second gas exhaust port 731".

In addition, unlike the above, when the second second gas injection port 711" from the bottom among the plurality of second gas injection ports 711" is arranged higher than the second second gas exhaust port 731" from the bottom among the plurality of second gas exhaust ports 731", the second gas G2 injected from the second second gas injection port 711 may be injected and exhausted in an inclined manner from the upper part to the lower part toward the second second gas exhaust port 731".

As mentioned above, as the second gas G2 flowing from the plurality of second gas injection ports 711" to the plurality of second gas exhaust ports 731" flows obliquely from the lower part to the upper part, or flows obliquely from the upper part to the lower part, the flow of the second gas G2 is generated in a relatively larger area than when the second gas G2 flows in the horizontal direction, making it possible to more effectively block the outside air flowing in from the external chamber.

In other words, when the main flow path of the second gas G2 is formed in an inclined direction instead of in the horizontal direction, rather than when the main flow path of the second gas G2 is formed in the horizontal direction, the relative area of the main flow path of the second gas G2 may become wider, and thus, more effective blocking of the outside air may be achieved.

As mentioned above, when the plurality of second gas injection ports 711" are formed in the right inner wall 131", the second gas G2 is supplied through the right chamber formed between the right outer wall 130 and the right inner wall 131", then is injected through the plurality of second gas injection ports 711", so that the second gas G2 may be injected and supplied from the left side of the front area 170" in the form of a surface injection.

In addition, when when the plurality of second gas exhaust ports 731" are formed in the left inner wall 121", the second gas G2 may be exhausted through the plurality of second gas exhaust ports 731" on the left side of the front area 170", then flow through the left chamber formed between the left outer wall 120 and the left inner wall 121" to be exhausted to the outside of the wafer storage container 10".

The wafer storage container 10" according to the third preferred embodiment of the present disclosure having the above configuration has following effects in addition to the above-described effects of the wafer storage container 10 according to the first preferred embodiment of the present disclosure.

Since the outside air blocking unit 700" is provided on the support 300 and the inner walls, the length from the front to the rear of the wafer storage container 10" can be made shorter than the that of the wafer storage container 10 according to the first preferred embodiment of the present disclosure, making it possible to manufacture a more compact wafer storage container 10".

As the second gas injection guide part 717" and the second gas exhaust guide part 737" guide the second gas G2, the second gas G2 can be injected obliquely to the front of the wafer storage container 10", then exhausted obliquely to the rear of the wafer storage container 10" when second gas G2 is injected and exhausted from one side to the other side. Therefore, the injection and exhaust of the second gas G2 to the outer area of the wafer storage container 10" are effectively made, and accordingly, the inflow of outside air into the storage chamber 160 through the external chamber can be blocked more effectively.

In other words, since the second gas G2 is injected obliquely to the front of the wafer storage container 10" and exhausted obliquely to the rear of the wafer storage container 10", when the wafer storage container 10" is connected to the external chamber, the second gas G2 is injected to a partial area inside the external chamber and then exhausted. Accordingly, the inflow of outside air in the external chamber into the storage chamber 160 and the front area 170" can be blocked more effectively.

In addition, by injecting the second gas G2 obliquely in the front direction of the wafer storage container 10", and obliquely exhausting the second gas G2 in the rear direction of the wafer storage container 10", it is possible to effectively inject and exhaust the second gas G2 through the outside air blocking unit 700" having a relatively smaller area than the outside air blocking unit 700 of the wafer storage container 10' according to the first preferred embodiment of the present disclosure, thereby achieving compactness of the wafer storage container 10".

Each of the above-described second gas injection guide parts 717" and second gas exhaust ports 731" of the outside air blocking unit 700" may be simultaneously provided on one side and the other side of the front area 170", that is, the left inner wall 120" and the right inner wall 130".

For example, the above-described second gas injection guide parts 717" and second gas exhaust ports 731" may be simultaneously provided on the left inner wall 120" that is the left side of the front area 170" and the right inner wall 130" that is the right side of the front area 170".

In this case, as the controller supplies the second gas G2 to only one of the second gas injection ports 711" provided on the left inner wall 120" and the right inner wall 130", and generates suction force only in the other one of the second gas exhaust ports 731" provided on the left inner wall 120" and the right inner wall 130", the flow of the second gas G2 from one side of the front area 170" to the other side, that is, the injection and exhaust of the second gas G2 in one direction may be made.

As above, by generating the flow of the second gas G2 in one direction, it is possible to prevent the occurrence of turbulence of the second gas G2 in the front area 170", thereby allowing outside air to be introduced into the inside of the wafer storage container 10" more effectively.

Wafer Storage Container 10''' According to a Fourth Preferred Embodiment of the Present Disclosure Hereinafter, a wafer storage container 10''' according to a fourth preferred embodiment of the present disclosure will be described with reference to FIG. 14.

Figure 14:
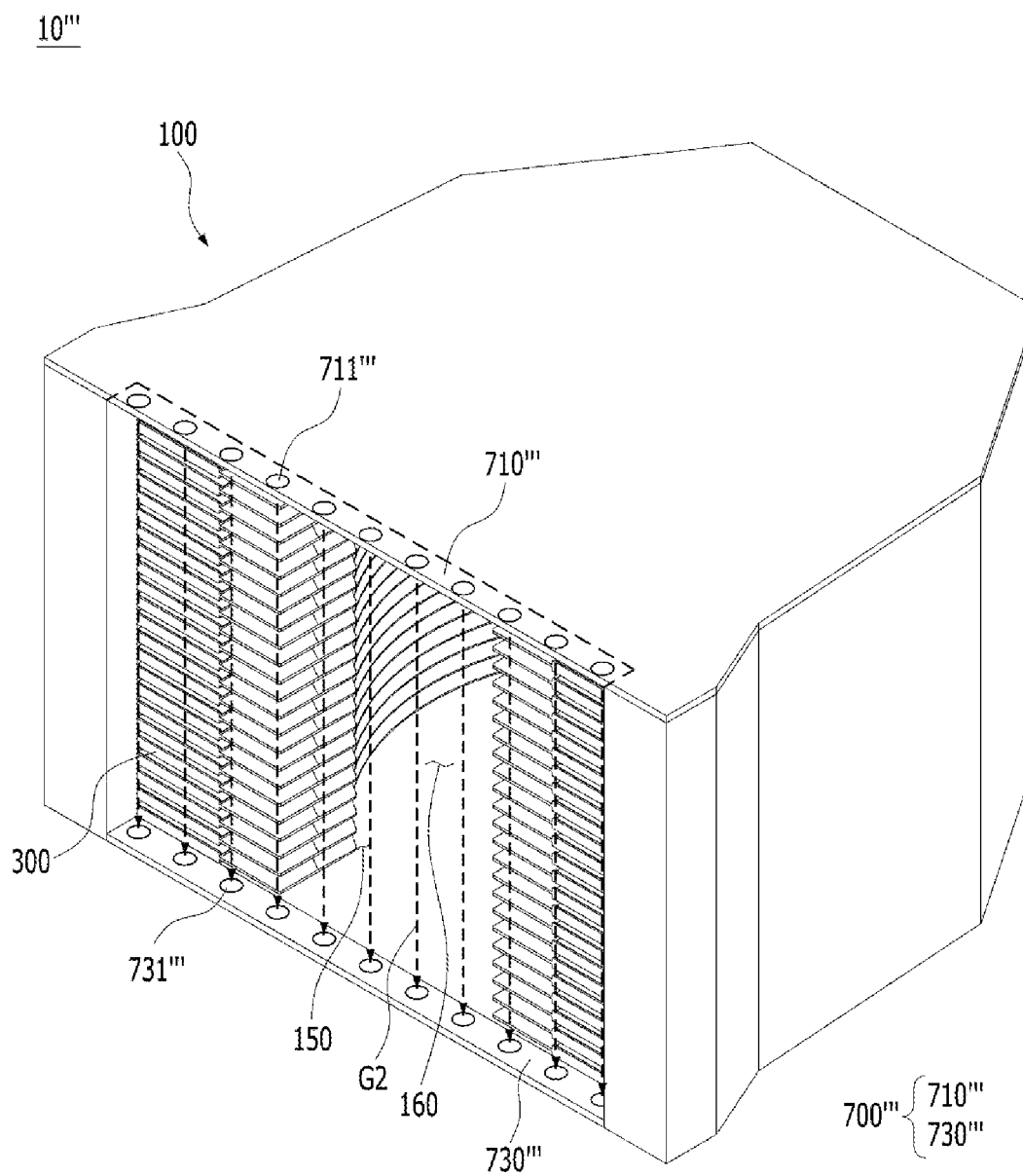
FIG. 14 is a perspective view of a wafer storage container according to a fourth preferred embodiment of the present disclosure.

FIG. 14 is a perspective view of a wafer storage container according to a fourth preferred embodiment of the present disclosure.

Compared with the wafer storage container 10 according to the first preferred embodiment of the present disclosure described above, the wafer storage container 10''' according to the fourth preferred embodiment of the present disclosure only differs in the shapes of a second gas injection nozzle 710''' and a second gas exhaust nozzle 730''' of an outside air blocking unit 700''' and the injection/exhaust directions, and the rest of the components are the same. Accordingly, the description of the remaining components may be replaced with the above description.

In addition, the covered shape of the inside of the wafer storage container 10''' that is hidden of FIG. 14 may be referred to the drawing of FIG. 1. That is, in the case of the shape of the inside of the wafer storage container 10''' (that is, the shape of the inside of the main body 100), the wafer storage container 10 according to the first embodiment and the wafer storage container 10''' according to the fourth embodiment is the same, and the same reference numerals may be applied by analogy with FIG. 1.

As shown in FIG. 14, the wafer storage container 10''' according to the fourth preferred embodiment of the present disclosure may include: a main body 100 having a front opening 150 and a storage chamber 160; the storage chamber 160 in which a wafer W is accommodated through an external chamber connected to the wafer storage container 10; a plurality of supports 300 provided in the storage chamber 160 in the vertical direction to respectively support the plurality of wafers W; a fume removal unit 500 that injects a first gas G1 into the storage chamber 160 and exhausts the first gas G1 to remove fumes of the wafer W; and an outside air blocking unit 700''' that injects and exhausts a second gas G2 from top to bottom in a front area of the front opening 150 in order to block the airflow of the external chamber from entering the storage chamber 160.

The outside air blocking unit 700''' may be configured to include: a second gas injection nozzle 710''' that injects the second gas G2 from top to bottom; and a second gas exhaust nozzle 730''' positioned under the second gas injection nozzle 710''' and exhausts the second gas G2 injected from the second gas injection nozzle 710'''.

As shown in FIG. 14, the second gas injection nozzle 710''' may be disposed on the front upper portion of the wafer storage container 10''', that is, on the upper portion of the front area of the front opening 150 so as to be located above the support 300 located at a highest position among the plurality of supports 300.

A plurality of second gas injection ports 711''' are provided on a lower surface of the second gas injection nozzle 710''' in the horizontal direction, that is, in the left-right direction. Accordingly, the lower surface of the second gas injection nozzle 710''' is the injection surface through which the second gas G2 is injected.

The second gas exhaust nozzle 730''' may be disposed on the front lower portion of the wafer storage container 10''', that is, on the lower portion of the front area of the front opening 150 so as to be located under the support 300 located at the lowest position among the plurality of supports 300.

A plurality of second gas exhaust ports 731''' are provided on an upper surface of the second gas exhaust nozzle 730''' in a horizontal direction, that is, in a left-right direction. Accordingly, the upper surface of the second gas exhaust nozzle 730''' is the exhaust surface through which the second gas G2 is exhausted.

The second gas injection ports 711''' and the second gas exhaust ports 731''' are provided with the same number in plurality, and are provided to correspond to each other in a vertical direction. Therefore, when the second gas G2 is injected from the plurality of second gas injection ports 711''' and then exhausted to the plurality of second gas exhaust ports 731''', the second gas G2 is injected and exhausted almost vertically.

As described above, as the second gas G2 is injected from the second gas injection nozzle 710''' and exhausted from the second gas exhaust nozzle 730''', it is possible to effectively block the inflow of outside air into the storage chamber 160 through the front opening 150.

That is, in the wafer storage container 10 according to the first embodiment of the present disclosure, the outside air blocking unit 700 injects and exhausts the second gas G2 in the horizontal direction to prevent the inflow of outside air into the storage chamber 160, whereas in the wafer storage container 10''' according to the fourth embodiment of the present disclosure, the outside air blocking unit 700''' injects and exhausts the second gas G2 in the vertical direction to prevent the inflow of outside air into the storage chamber 160.

By blocking the outside air in the vertical direction, that is, in the top-to-bottom direction, in this way, when the robot arm accommodates the wafer W in the storage chamber, the second gas G2 injected from the second gas injection nozzle 710''' is injected onto the upper surface of the wafer W, and thus the fumes can be partially removed.

Unlike the above, the second gas injection port 711''' and the second gas exhaust port 731''' are provided with a plurality of the same number, but may be alternately disposed so as not to face each other vertically. Therefore, when the second gas G2 is injected from the plurality of second gas injection ports 711''' and then exhausted to the plurality of second gas exhaust ports 731''', the second gas G2 is injected and exhausted in an up-and-down diagonal direction. As such, when the second gas G2 is injected and exhausted in the up-and-down diagonal direction, outside air can be blocked more tightly by the second gas G2.

The second gas injection nozzle 710''' and the second gas exhaust nozzle 730''' may be provided in plurality so that the outside air is blocked in each of the plurality of wafers W supported on each of the plurality of supports 300.

In this case, each of the plurality of second gas injection nozzles 710''' and the plurality of second gas exhaust nozzles 730''' may be disposed on the upper and lower portions of each of the plurality of supports 300.

In other words, the arrangement of the second gas injection nozzle 710''', the support 300, and the second gas exhaust nozzle 730''' from the top to the bottom of the wafer storage container 10''' may be made continuously. Accordingly, injection and exhaust of the second gas G2 of the second gas injection nozzle 710''' and the second gas exhaust nozzle 730''' may be performed in front of one support 300. In this case, the number of the plurality of supports 300, the number of the plurality of wafers W, the number of the plurality of second gas injection nozzles 710''', and the number of the plurality of second gas exhaust nozzles 730''' are the same.

The plurality of second gas injection nozzles 710''' and the plurality of second gas exhaust nozzles 730''' may each individually inject and exhaust the second gas G2.

In other words, when the wafer W is stored in the storage chamber 160 or when the wafer W is taken out of the storage chamber 160, the injection and exhaust of the second gas G2 through the second gas injection nozzle 710''' and the second gas exhaust nozzle 730''' of any one of the plurality of supports 300 may not be performed selectively. Accordingly, by performing the injection and exhaust of the second gas G2 through the second gas injection nozzle 710''' and the second gas exhaust nozzle 730''' disposed on the upper and lower portions, respectively, of the desired support 300 among the plurality of supports 300, it is possible to achieve the desired area's outside air blocking.

Wafer Storage Container 10'''' According to a Fifth Preferred Embodiment of the Present Disclosure Hereinafter, a wafer storage container 10'''' according to a fifth preferred embodiment of the present disclosure will be described with reference to FIG. 15.

Figure 15:
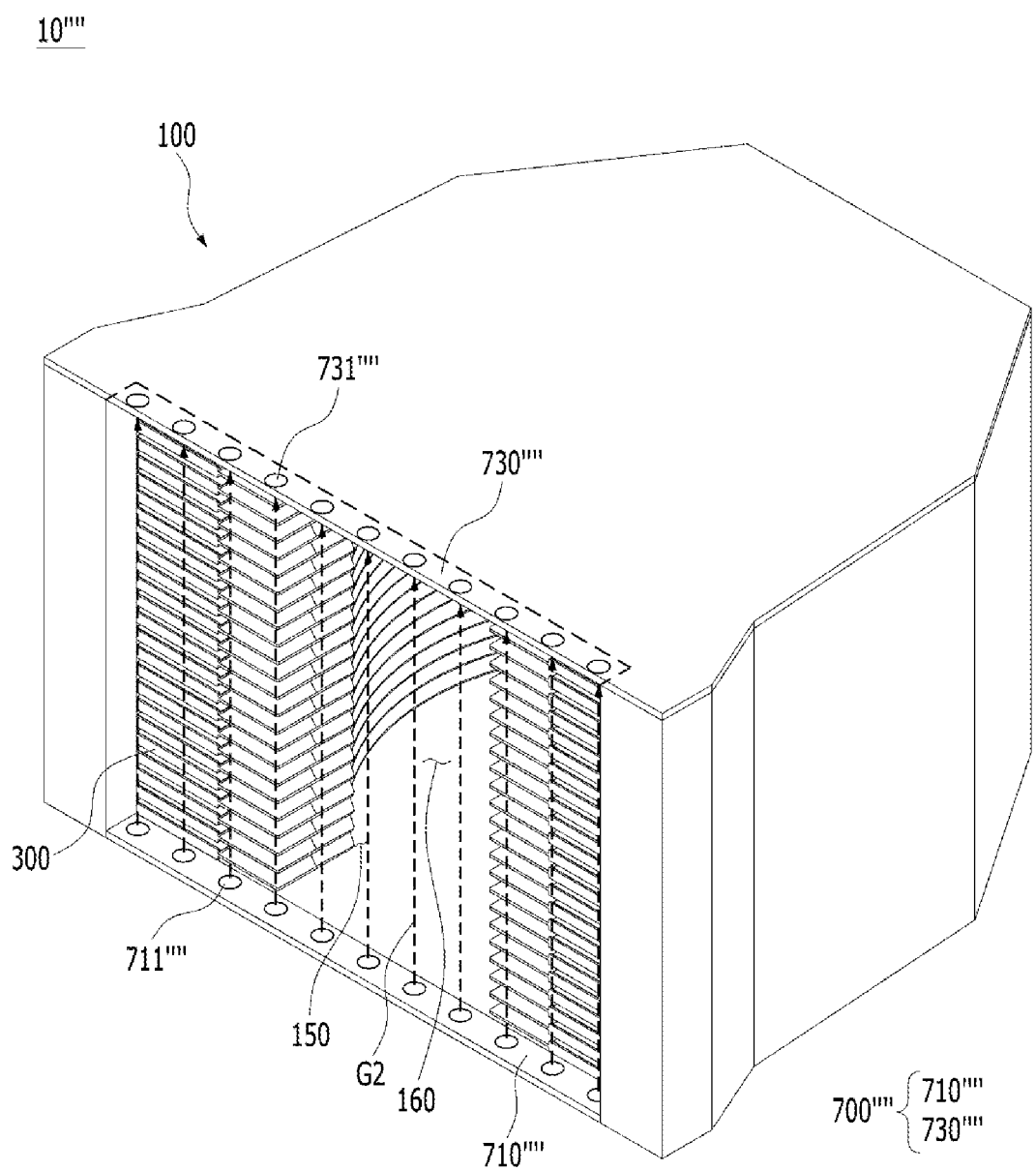
FIG. 15 is a perspective view of a wafer storage container according to a fifth preferred embodiment of the present disclosure.

FIG. 15 is a perspective view of a wafer storage container according to a fifth preferred embodiment of the present disclosure.

Compared with the wafer storage container 10''' according to the fourth preferred embodiment of the present disclosure described above, the wafer storage container 10'''' according to the fifth preferred embodiment of the present disclosure only differs in the positions of a second gas injection nozzle 710'''' and a second gas exhaust nozzle 730'''' of an outside air blocking unit 700'''', and the rest of the components are the same. Accordingly, the description of the remaining components may be replaced with the above description.

In addition, the covered shape of the inside of the wafer storage container 10''' that is hidden of FIG. 14 may be referred to the drawing of FIG. 1. That is, in the case of the shape of the inside of the wafer storage container 10'''' (that is, the shape of the inside of the main body 100), the wafer storage container 10 according to the first embodiment and the wafer storage container 10'''' according to the fifth embodiment is the same, and the same reference numerals may be applied by analogy with FIG. 1.

As shown in FIG. 15, the wafer storage container 10'''' according to the fifth preferred embodiment of the present disclosure may include: a main body 100 having a front opening 150 and a storage chamber 160; the storage chamber 160 in which a wafer W is accommodated through an external chamber connected to the wafer storage container 10; a plurality of supports 300 provided in the storage chamber 160 in the vertical direction to respectively support the plurality of wafers W; a fume removal unit 500 that injects a first gas G1 into the storage chamber 160 and exhausts the first gas G1 to remove fumes of the wafer W; and an outside air blocking unit 700'''' that injects and exhausts a second gas G2 from top to bottom in a front area of the front opening 150 in order to block the airflow of the external chamber from entering the storage chamber 160, wherein the outside air blocking unit 700'''' may include: a second gas injection nozzle 710'''' that injects the second gas G2 from bottom to top; and a second gas exhaust nozzle 730'''' disposed above the second gas injection nozzle 710'''' to exhaust the second gas G2 injected from the second gas injection nozzle 710''''.

As shown in FIG. 15, the second gas injection nozzle 710'''' may be disposed on the front lower portion of the wafer storage container 10'''', that is, on the lower portion of the front area of the front opening 150 so as to be located under the support 300 located at a lowest position among the plurality of supports 300.

A plurality of second gas injection ports 711'''' are provided on an upper surface of the second gas injection nozzle 710'''' in the horizontal direction, that is, in the left-right direction. Accordingly, the upper surface of the second gas injection nozzle 710'''' is the injection surface through which the second gas G2 is injected.

The second gas exhaust nozzle 730'''' may be disposed on the front upper portion of the wafer storage container 10'''', that is, on the upper portion of the front area of the front opening 150 so as to be located above the support 300 located at the highest position among the plurality of supports 300.

A plurality of second gas exhaust ports 731'''' are provided on a lower surface of the second gas exhaust nozzle 730'''' in the horizontal direction, that is, in the left-right direction. Accordingly, the lower surface of the second gas exhaust nozzle 730'''' is the exhaust surface through which the second gas G2 is exhausted.

The second gas injection ports 711'''' and the second gas exhaust ports 731'''' are provided with the same number in plurality, and are provided to correspond to each other in a vertical direction. Therefore, when the second gas G2 is injected from the plurality of second gas injection ports 711'''' and then exhausted to the plurality of second gas exhaust ports 731'''', the second gas G2 is injected and exhausted almost vertically.

In the wafer storage container 10'''' according to the fifth preferred embodiment of the present disclosure, as the second gas G2 is injected from the second gas injection nozzle 710'''' and exhausted from the second gas exhaust nozzle 730'''', it is possible to effectively block the inflow of outside air into the storage chamber 160 through the front opening 150.

That is, in the wafer storage container 10 according to the first embodiment of the present disclosure, the outside air blocking unit 700 injects and exhausts the second gas G2 in the horizontal direction to prevent the inflow of outside air into the storage chamber 160, whereas in the wafer storage container 10'''' according to the fifth embodiment of the present disclosure, the outside air blocking unit 700'''' injects and exhausts the second gas G2 in the vertical direction to prevent the inflow of outside air into the storage chamber 160.

When the second gas injection nozzle 710"" blocks the outside air by injecting the second gas G2 from the bottom to the top, it is possible to more effectively block the outside air.

To be specific, nitrogen or an inert gas, which is generally lighter than air, may be used as the first gas G1 injected into the storage chamber 160. Therefore, the first gas G1 inside the storage chamber 160 rises upward, and thus, the density of the first gas G1 in the lower area inside the storage chamber 160 is relatively lower than the density of the first gas G1 in the upper area. Accordingly, the outside air is mainly introduced into the inner lower area of the storage chamber 160 having a relatively low density. In the case of the wafer storage container 10"" according to the fifth embodiment of the present disclosure, since the second gas injection nozzle 710"" blocks the outside air by injecting the second gas G2 from the bottom to the top, it is possible to more effectively block the outside air intensively flowing into the inner lower area of the storage chamber 160.

Unlike the above, the second gas injection port 711"" and the second gas exhaust port 731"" are provided with a plurality of the same number, but may be alternately disposed so as not to face each other vertically. Therefore, when the second gas G2 is injected from the plurality of second gas injection ports 711"" and then exhausted to the plurality of second gas exhaust ports 731"", the second gas G2 is injected and exhausted in an up-and-down diagonal direction. As such, when the second gas G2 is injected and exhausted in the up-and-down diagonal direction, outside air can be blocked more tightly by the second gas G2.

The second gas injection nozzle 710"" and the second gas exhaust nozzle 730"" may be provided in plurality so that the outside air is blocked in each of the plurality of wafers W supported on each of the plurality of supports 300.

In this case, each of the plurality of second gas injection nozzles 710"" and the plurality of second gas exhaust nozzles 730"" may be disposed on the lower and upper portions of each of the plurality of supports 300.

In other words, the arrangement of the second gas injection nozzle 710"", the support 300, and the second gas exhaust nozzle 730"" from the bottom to the top of the wafer storage container 10"" may be made continuously. Accordingly, injection and exhaust of the second gas G2 of the second gas injection nozzle 710"" and the second gas exhaust nozzle 730"" may be performed in front of one support 300. In this case, the number of the plurality of supports 300, the number of the plurality of wafers W, the number of the plurality of second gas injection nozzles 710"", and the number of the plurality of second gas exhaust nozzles 730"" are the same.

The plurality of second gas injection nozzles 710"" and the plurality of second gas exhaust nozzles 730"" may each individually inject and exhaust the second gas G2.

In other words, when the wafer W is stored in the storage chamber 160 or when the wafer W is taken out of the storage chamber 160, the injection and exhaust of the second gas G2 through the second gas injection nozzle 710"" and the second gas exhaust nozzle 730"" of any one of the plurality of supports 300 may not be performed selectively. Accordingly, by performing the injection and exhaust of the second gas G2 through the second gas exhaust nozzle 730"" and the second gas injection nozzle 710"" disposed on the upper and lower portions, respectively, of the desired support 300 among the plurality of supports 300, it is possible to achieve the desired area's outside air blocking.

The above-described second gas injection nozzle 710''' and second gas exhaust nozzle 730''' of the wafer storage container 10''' according to the fourth embodiment of the present disclosure and second gas injection nozzle 710"" and second gas exhaust nozzle 730"" of the wafer storage container 10"" according to the fifth embodiment of the present disclosure may be configured with only one nozzle or may be configured in combination with each other.

For example, the second gas injection nozzle may be provided on the upper portion and on the lower portion of the front area of the front opening of the wafer storage container, or the second gas exhaust nozzle may be provided on the upper portion and on the lower portion of the front area of the front opening of the wafer storage container, or the second gas injection nozzle or the second gas exhaust nozzle may be provided on the lower portion of the front area of the front opening of the wafer storage container.

As described above, although it has been described with reference to preferred embodiments of the present disclosure, those skilled in the art may variously modify or change the present disclosure within the scope without departing from the spirit and scope of the present disclosure described in the claims below.

What is claimed is:

1. A wafer storage container connected to an external chamber and having a storage chamber in which wafers received through a front opening are accommodated, the wafer storage container comprising:
   a support for supporting the wafers;
   a fume removal unit that injects a first gas into the storage chamber and exhausts the first gas; and
   an outside air blocking unit that injects a second gas from a left side of the front opening and exhausts the second gas from a right side of the front opening,
   wherein the outside air blocking unit comprises:
   a second gas injection nozzle having a plurality of second gas injection ports for injecting the second gas and located in front of the support; and
   a second gas exhaust nozzle having a plurality of second gas exhaust ports for exhausting the second gas and located in front of the support.

2. The wafer storage container of claim 1, wherein the first gas injected from the fume removal unit is exhausted to a first gas exhaust part of the fume removal unit, and
   the second gas injected from the outside air blocking unit is exhausted to the second gas injection nozzle of the outside air blocking unit.

3. The wafer storage container of claim 1, wherein the outside air blocking unit obliquely injects the second gas so that the injected second gas is directed toward a front of the wafer storage container toward the right side of the front opening.

4. The wafer storage container of claim 1, wherein the left side of the front opening is an injection surface provided with the plurality of second gas injection ports in the second gas injection nozzle, wherein the injection surface is formed to be inclined toward a front of the wafer storage container, and
   the right side of the front opening is an exhaust surface provided with the plurality of second gas exhaust ports in the second gas exhaust nozzle, wherein the exhaust surface is formed toward the front of the wafer storage container.

5. The wafer storage container of claim 1,
   wherein an arrangement height of the plurality of second gas injection ports and an arrangement height of the plurality of second gas exhaust ports are different from each other.

6. A wafer storage container connected to an external chamber and having a storage chamber in which wafers received through a front opening are accommodated, the wafer storage container comprising:
- a fume removal unit that injects a first gas into the storage chamber and exhausts the first gas; and
- an outside air blocking unit that injects a second gas from a left side of the front opening and exhausts the second gas from a right side of the front opening,
- wherein the outside air blocking unit obliquely exhausts the second gas so that the exhausted second gas is directed toward a rear of the wafer storage container toward the right side of the front opening.

7. A wafer storage container connected to an external chamber and having a storage chamber in which wafers received through a front opening are accommodated, the wafer storage container comprising:
- a support for supporting the wafers;
- a main body having a front area between the storage chamber and the front opening, in which an area except for the front opening is closed;
- a fume removal unit that injects a first gas into the storage chamber and exhausts the first gas; and
- an outside air blocking unit that injects a second gas from a left side of the front area and exhausts the second gas from a right side of the front area,
- wherein the outside air blocking unit comprises:
- a second gas injection nozzle having a plurality of second gas injection ports for injecting the second gas and located in front of the support; and
- a second gas exhaust nozzle having a plurality of second gas exhaust ports for exhausting the second gas and located in front of the support.

8. The wafer storage container of claim 7, wherein the outside air blocking unit comprises:
- a second gas injection port provided on a left side surface of the front area to inject the second gas; and
- a second gas exhaust port provided on a right side surface of the front area to exhaust the second gas.

9. The wafer storage container of claim 8, wherein the second gas injection port is provided in plurality at upper and lower sides of the first side surface of the front area, and
- the second gas exhaust port is provided in plurality at upper and lower sides of the second side surface of the front area,
- wherein an arrangement height of the plurality of second gas injection ports and an arrangement height of the plurality of second gas exhaust ports are different from each other.

10. A wafer storage container connected to an external chamber and having a storage chamber in which wafers received through a front opening are accommodated, the wafer storage container comprising:
- a support for supporting the wafers;
- a main body having a front area between the storage chamber and the front opening, in which an area except for the front opening is closed;
- a fume removal unit that injects a first gas into the storage chamber and exhausts the first gas; and
- an outside air blocking unit that injects a second gas from a left side of the front area and exhausts the second gas from a right side of the front area,
- wherein the outside air blocking unit comprises:
- a second gas injection guide part that guides the second gas so that the second gas injected from a second gas injection port is directed toward a front of the wafer storage container as going toward the right side of the front area; and
- a second gas exhaust guide part that guides the second gas so that the second gas exhausted from a second gas exhaust port is directed toward a rear of the wafer storage container as going toward the right side of the front area.

\* \* \* \* \*